(12) United States Patent
Miyauchi

(10) Patent No.: US 6,668,026 B1
(45) Date of Patent: Dec. 23, 2003

(54) DECODING METHOD AND APPARATUS

(75) Inventor: Toshiyuki Miyauchi, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/578,582

(22) Filed: May 25, 2000

(30) Foreign Application Priority Data

May 28, 1999 (JP) .......................................... P11-150751

(51) Int. Cl.$^7$ .......................... H04L 27/06; H03M 13/03
(52) U.S. Cl. ...................................... 375/341; 714/794
(58) Field of Search ................................ 375/316, 340, 375/341, 262; 714/786, 795, 794

(56) References Cited

U.S. PATENT DOCUMENTS

| | | | | |
|---|---|---|---|---|
| 5,390,198 A | * | 2/1995 | Higgins | ....................... 714/796 |
| 5,923,713 A | * | 7/1999 | Hatakeyama | ................ 375/341 |
| 6,098,193 A | * | 8/2000 | Itoi | ............................. 714/795 |

* cited by examiner

Primary Examiner—Tesfaldet Bocure
(74) Attorney, Agent, or Firm—Frommer Lawrence & Haug LLP; William S. Frommer

(57) ABSTRACT

A path memory and likelihood update circuit 16 provided in a two-step SOVA decoder includes eight RAMs 32a, 32b, . . . , 32h to store path selection information indicative of a selection of a most likely path in each state of an input convolutional code, a trace result memory circuit 34 to store the result of most likely path tracing and output it as delay trace result signal s42, a most likely path Δ memory circuit 35 to select and store a metric difference for the most likely path based on the delay trace result signal s42 and output it as delay most likely Δ signal s43, and a minimum Δ memory circuits 37a and 37b to store a minimum value of the metric difference for the most likely path in each state of the convolutional code based on the delay trace result signal s42 and delay most likely Δ signal s43.

17 Claims, 23 Drawing Sheets

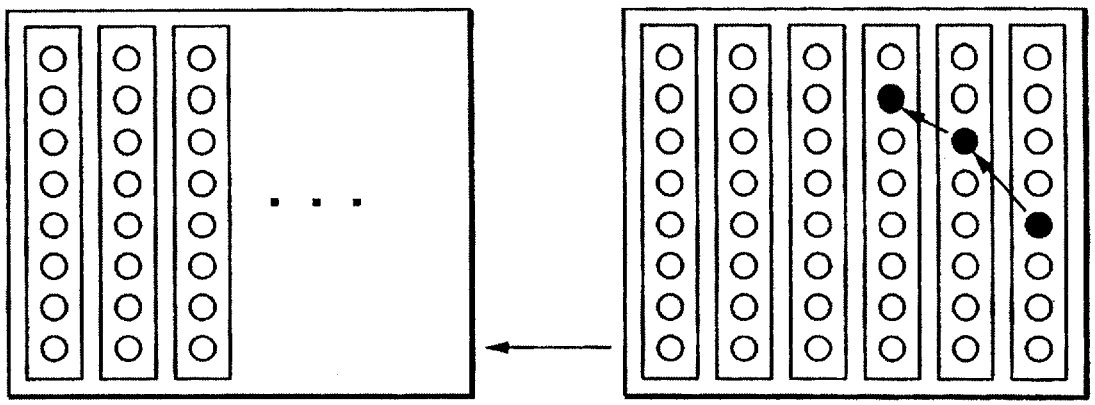
FIG.15A
(PRIOR ART)
FIG.15D
(PRIOR ART)
SEQUENTIAL SELECTION
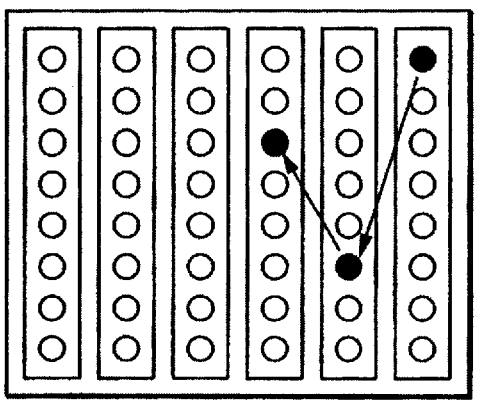
FIG.15B
(PRIOR ART)
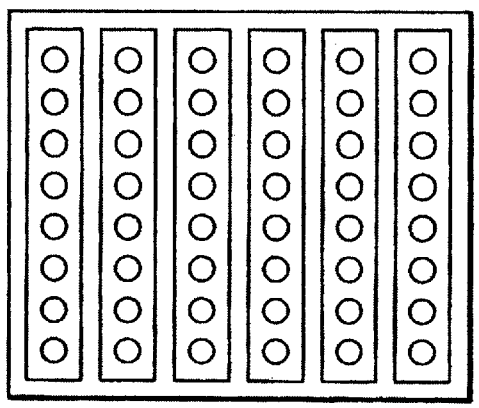
FIG.15C
(PRIOR ART)

DECODING METHOD AND APPARATUS

BACKGROUND OF THE INVENTION

1. Field of the Invention

The present invention relates to a decoding method and apparatus suitable for maximum likelihood decoding of a convolutional code, and more particularly, to a decoding method and apparatus suitably usable in a satellite broadcasting, etc.

2. Description of the Related Art

Recently, researches have been made to minimize the symbol error probability by soft-output of decoded code of concatenated codes and iterative output in the iterative decoding method and decoding methods suitable for acquisition of a soft-output are sought with a great interest. The soft output Viterbi algorithm disclosed in "A Viterbi Algorithm with Soft-Decision Outputs and Its Application, Hagenauer and Hoeher, Proc. IEEE Global Telecoim. Conf GLOBECOM, pp. 47.1.1–47.1.7, November 1989" is one of the decoding methods for soft output during decoding of an convolutional code. In the Viterbi algorithm with soft-decision outputs, each symbol is not output as a result of decoding but a likelihood of each symbol is output. Such an output is called a soft-output. What the soft-output Viterbi algorithm (will be referred to as "SOVA" hereinafter) is will be described.

As shown in FIG. 1, digital information is convolved by a convolutional encoder 101, an output from the convolutional encoder 101 is supplied to a decoder 103 via a memoryless channel 102 with noises, and the output is decoded by the decoder 103.

First, M states (transition) of a shift register in the convolutional encoder 101 are represented by m $(0, 1, \ldots, M-1)$, a state at a time t is represented by St, an input at the time t is represented by it, an output at the time t is represented by Xt, and an output sequence is represented by Xtt'=Xt, Xt+1, . . . , Xt'.

The convolutional coding will start at a state S0=0 and end at a state ST=0 with output of X1T. The memoryless channel 102 with noises is supplied with X1T, and outputs Y1T. It is assumed here that Ytt' Yt, Yt+1, . . . , Yt'. The transition probability of the memoryless channel 102 with noises is defined by $R(\cdot|\cdot)$ which will be as given by the expression (1) for all t ($1 \leq t \leq T$).

$$Pr\{Y_1^t \mid X_1^t\} = \prod_{j=1}^{t} R(Y_j \mid X_j) \quad (1)$$

A likelihood of input information $\lambda t$ is defined by the expression (2):

$$\lambda_t = \frac{Pr\{i_t = 1 \mid Y_1^T\}}{Pr\{i_t = 0 \mid Y_1^T\}} \quad (2)$$

The input information likelihood $\lambda t$ is a one at the time t when Y1T has been received. It is a soft-output to be determined. Practically, however, the value of $\lambda t$ itself is less frequently determined than its natural logarithmic value log $\lambda t$. In the following description, the log $\lambda t$ will be referred to as "logarithmic likelihood ratio".

With the SOVA, the likelihood is not directly determined but a likelihood of a path not selected at each time of the process of selection in the Viterbi decoding, in which a most likely path being sequence most likely to a received code sequence is derived, is used to determine a likelihood of a decoded bit of the most likely path, thereby determining the likelihood of each input information by approximation.

Assuming that the most likely path is PtML, the path not selected as a result of the comparison with the most likely path at a time j is Ptj, a bit entered at the time t of the path Pt is taken as I[Pt, t], the likelihood of the path Pt when Y1T is received is Pr(Pt|Y1T) and a set of the paths Ptj is $\rho$, a definition is made as given by the expression (3):

$$\rho_0(t) = \{Pr: Pt \in \rho, I[Pt, t] \neq I[Pt_{ML}, t]\} \quad (3)$$

With the SOVA, the logarithmic likelihood ratio of the decoded bit at the time t is computed by approximation using the expression (4). Thus, the logarithmic likelihood ration of the decoded bit can be determined as a path-metric difference during Viterbi decoding.

$$\log \frac{\max\{Pr\{Pt|Y_1^T\}: Pt \in \rho_0(t)\}}{Pr\{Pt_{ML} Y_1^T\}} = \quad (4)$$
$$\log\{\max\{Pr\{Pt \mid Y_1^T\}: Pt \in \rho_0(t)\} - \log Pr\{Pt_{ML} \mid Y_1^T\}$$

Note that with the SOVA, the logarithmic likelihood ratio is computed as a likelihood of the most likely path in relation to the decoded bit, namely, in the form of the expression (5) or (6):

Decoded bit=0

$$\rightarrow Pr\{i_t=1|Y_1^T\}/Pr\{i_t=0|Y_1^T\}(=\lambda_t) \quad (5)$$

Decoded bit=1

$$\rightarrow Pr\{i_t=0|Y_1^T\}/Pr\{1|Y_1^T\}(=1/\lambda_t) \quad (6)$$

The SOVA algorithm will further be described below:

FIG. 2 shows the merging of paths in the state k at the time j. As shown, a path selected is represented by P1(k, j), and a path not selected is by P2(k, j). A state through which the path P1(k, j) passes at a time j−1 is represented by s1(k), a state through which the path P2(k, j) passes is represented by s2(k), and a path-metric difference between the paths P1(k, j) and P2(k, j) is represented by $\Delta k(j)$. Bits decoded between the paths P1(k, j) and P2(k, j) at the time t are represented by I[P1(k, j), t] and I[P2(k, j), t], respectively, and the logarithmic likelihood ratio between the decoded bits of survivor paths in the state k when paths counted up to the time t have been selected is represented by L^t(k, j).

Using the above notation, the decoding procedure with the SOVA will be as follows:

With the SOVA, all the times and states t and k are first initialized to have a logarithmic likelihood ration of L^t(k, 0).

Next, with the SOVA, operations given by the expressions (7) and (8) are made on all the states k and times t (t=1 to j) during path selection at each time j:

$$I[P_1(k, j), t] \neq I[P_2(k, j), t] \rightarrow L^{\hat{}}_t(k, j) = \min \{L^{\hat{}}_t(s^1(k), j-1), \Delta_k(j)\} \quad (7)$$

$$I[P_1(k, j), t] = I[P_2(k, j), t] \rightarrow L^{\hat{}}_t(k, j) = \min \{L^{\hat{}}_t(s^1(k), j-1)\} \quad (8)$$

With the SOVA, assuming that the last time is T and the most likely state is k0, the logarithmic likelihood ratio being a last soft-output is determined as L^t(k0, T).

When the SOVA is installed in a hardware, the hardware will be a SOVA decoder 110 architected as shown in FIG. 3.

The SOVA decoder 110 includes a branch-metric computation circuit 111 to compute a branch-metric which is a Hamming distance between a received signal and path, an add compare select (ACS) circuit 112 to compare the branch-metric computed by the branch-metric circuit 111 with a state-metric being a cumulative sum of the preceding branch-metrics, a nonnalization circuit 113 to normalize a new state-metric signal s113 output from the ACS circuit 112, a state-metric memory circuit 114 to store a normalized state-metric signal s114 output from the normalization circuit 113, and a path memory and likelihood update circuit 115 supplied with path selection information s116, metric-difference information s117 and a most likely state signal s118 from the ACS circuit 112 to output a decoded data s119 and logarithmic likelihood ratio s120.

When the SOVA decoder 110 is supplied with a received value Yt, a priory probability information log Pr(it=0) and log Pr(it=1) as s111, it will output the decoded data s119 being a result of decoding and the logarithmic likelihood ratio s120, respectively.

When the branch-metric computation circuit 111 is supplied with a received value and a priory probability information s111, it computes a branch-metric of the received data, and outputs the result of computation as branch-metric signal s112 to the downstream ACS circuit 112.

Based on the branch-metric signal s112 supplied from the branch-metric computation circuit 111 and state-metric signal s115 supplied from the state-metric memory circuit 114, the ACS circuit 112 adds the branch-metric and state-metric to each of two paths merging in a state for comparison of the two paths. Based on the result of comparison, the ACS circuit 112 selects a more likely path and takes it as a new state-metric. The ACS circuit 112 outputs the selected path as path selection information s116 to the downstream path memory and likelihood update circuit 115. Further the ACS circuit 112 outputs a metric difference found when a path is selected in each state as a metric difference s117 to the path memory and likelihood update circuit 115. Moreover, the ACS circuit 112 outputs a number of a having a minimum state-metric as most likely state signal s118 to the path memory and likelihood update circuit 115 and a newly obtained state-metric as new state-metric signal s113 to the downstream nonnalization circuit 113.

The path selection by the ACS circuit 112 will be explained concerning a convolutional encoder with a constraint length of 3 shown in FIG. 4. The convolutional encoder 130 corresponds to the convolutional encoder 51 shown in FIG. 1. The convolutional encoder 130 includes three adders 131a, 131b and 131c and two registers 132a and 132b. In the transition diagram (will be referred to as "trellis" hereinafter) of this convolutional encoder 130, there are always two merging paths in each state at each time slot as shown in FIG. 5. As mentioned above, the ACS circuit 112 will add a branch-metric and state-metric between a received signal and path to each of the two paths merging in a state and compare the paths for comparison with the paths. Based on the result of comparison, the ACS circuit 112 will select a more likely one of the paths.

The normalization circuit 113 subtracts a minimum state-metric, for example, from the new state-metric signal s113 output from the ACS circuit 112 to nonnalize the new state-metric signal s113 to a value within a preset range, and outputs it as normalized state-metric signal s114 to the downstream state-metric memory circuit 114.

The state-metric memory circuit 114 stores the normalized state-metric signal s114 supplied from the nonnalization circuit 113, and feeds it as state-metric signal s115 back to the ACS circuit 112.

Based on the path selection information s116 output from the ACS circuit 112, the path memory and likelihood update circuit 115 stores the decoded bits on the survivor paths in each state, and updates the likelihood of each decoded bit using the metric difference information s117 output from the ACS circuit 112. Also, based on the most likely state signal s118 output from the ACS circuit 112, the path memory and likelihood update circuit 115 outputs information a constant length called "terminating length" before the information corresponding to the most likely path as decoded data s119, and likelihood information as logarithmic likelihood ratio s120.

The SOVA decoder 110 is architected quite identically to the conventional Viterbi decoder 140 which implements the Viterbi algorithm as shown in FIG. 6 except for the path memory and likelihood update circuit 115. That is, similarly to the SOVA decoder 110, the conventional Viterbi decoder 140 includes a branch-metric computation circuit 141 to compute a branch-metric, an ACS circuit 142 to add a branch-metric and state-metric to paths for comparison of the paths, a nonnalization circuit 143 to normalize a new state-metric signal s143 output from the ACS circuit 142, a state-metric memory circuit 144 to store a nonnalized state-metric signal s144 output from the normalization circuit 143, and a path memory circuit 145 supplied with path selection information s146 and metric-difference information s147 from the ACS circuit 142 to output decoded data s148.

As in the above, different from the conventional Viterbi decoder 140, the SOVA decoder 110 includes the path memory and likelihood update circuit 115 to output likelihood information.

The path memory and likelihood update circuit 115 will be described below with reference to FIGS. 7 to 9. As shown, in the path memory and likelihood update circuit 115, a memory cell $MS_B$ consisting of a selector and register is disposed on the trellis to shift, based on the path selection information s116 output from the ACS circuit 112, the content of the register when storing the decoded bit and that of the register when storing the likelihood information.

The memory cell $MS_B$ to store the decoded bit is architected as shown in FIG. 7. As shown, the memory cell $MS_B$ includes a selector 151 supplied with a select signal based on the path selection information s116 output from the ACS circuit 112 to select one of two input bits based on the select signal, and a register 152 to store as decoded bits the input bits selected by the selector 151. Note that the memory cell $MS_B$ to store the decoded bit is architected quite identically to the memory cell in the conventional Viterbi decoder 140 shown in FIG. 6.

On the other hand, the memory cell $MS_B$ to store the likelihood information is architected as shown in FIG. 8. That is, the memory cell $MS_B$ includes a selector 153 supplied with a select signal based on the path selection information s116 output from the ACS circuit 112 to select one of two likelihood information based on the select signal, a decision circuit 154 to judge whether two decoded bits b1 and b2 supplied from the memory cell $MS_B$ to store the decoded bit are in a relation that b1≠b2 and whether two metric differences $\Delta1$ and $\Delta2$ based on the metric difference information s117 output from the ACS circuit 112 are in a relation that $\Delta1<\Delta2$, a selector 155 to select the metric difference $\Delta1$ when the result of decision from the decision circuit 154 is that b1≠b2 and $\Delta1<\Delta2$, and the metric difference $\Delta2$ in other cases, and a register 156 to store as likelihood information the metric difference selected by the selector 155.

The memory cell $MS_B$ to store a decoded bit and memory cell $MS_P$ to store likelihood information are disposed as shown in FIG. 9 when the constraint length is 3. Note that these memory cells $MS_B$ and $MS_P$ are disposed correspondingly to the trellis of the convolutional encoder 130 shown in FIG. 5. In the SOVA decoder 110, the memory cell $MS_B$ to store a decoded bit and memory cell $MS_P$ to store likelihood information thus disposed save information on the survivor paths in each state in the registers, respectively. Each of the memory cells $MS_B$ and $MS_P$ is disposed in number for the terminating length. The SOVA decoder 110 will selection information corresponding to the most likely path and a decoded data and logarithmic likelihood ratio by selecting a most likely state output from the outputs of the last ones of the memory cells $MS_B$ and $MS_P$, respectively. As will be evident, the memory cell $MS_B$ to store a decoded bit is architected quite identically to the path memory circuit 145 in the conventional Viterbi decoder 140 in FIG. 6.

The SOVA decoder 110 can implement the SOVA by an actual hardware.

The SOVA decoder 110 needs a number of memory cells $MS_B$ and a number of memory cells $MS_P$ for a number of states by the terminating length, respectively, as shown in FIG. 9. However, since in the SOVA decoder 110, the circuit scale of the memory cell $MS_P$ shown in FIG. 8 is larger than that of the memory cell $MS_B$ shown in FIG. 7, if the number of states and terminating length are larger, there will occur a problem that the circuit scale of the SOVA decoder 110 is considerably large in comparison with the conventional Viterbi decoder 140 shown in FIG. 6. To solve this problem, Joeressen and Berrou proposed the same approach independently of each other by their respective articles "Joeressen, Vaupel and Mey—High-Speed VLSI Architectures for Soft-Output Viterbi Decoding, in Proc. Int. Conf. Applicat. Specific Array Processors. Oakland, Calif.: IEEE Computer Society Press. August 1992, pp. 373–384" and "Berrou, Adde, Angui and Faudeil—A Low Complexity Soft-Output Viterbi Decoder Architecture, in Proc. IEEE Int. Conf. Commune., Geneva, Switzerland, May 1993, pp. 737–740". This approach will be called "two-step SOVA" as they call in their articles, and described below.

With the two-step SOVA, after a Viterbi decoding for an terminating length is done once, the likelihood information is updated only for a selected path. The two-step SOVA will need a two-times larger number of memory cells to store the decoded bit than in the SOVA decoder 110 but a number of memory cells to store the likelihood information only for the terminating length. Therefore, the two-step SOVA permits to reduce the number of the memory cells to store the likelihood information. As the result, the two-step SOVA makes it possible to considerably reduce the scale of the path memory and likelihood update circuit as a whole in view of the circuit scale of the memory cell to store the likelihood information.

FIG. 10 shows a two-step SOVA decoder. The two-step SOVA decoder is generally indicated with a reference 160. As shown, the two-step SOVA decoder 160 includes a branch-metric computation circuit 161 to compute a branch-metric, an ACS circuit 162 to the branch-metric and state-metric to each of two paths merging in a state for comparison of the two paths, a nonnalization circuit 163 to normalize a new state-metric signal s163 output from the ACS circuit 162, a state-metric memory circuit 164 to store a nonnalized state-metric signal s164 output from the nonnalization circuit 163, an upstream path memory circuit 165 to store decoded bits on survivor paths in each state and output delay state information s169, a path selection information delay circuit 166 to delay path delay information s166, a metric difference delay circuit 167 to delay metric difference information s167, a selection circuit 168 to select from a metric difference delay signal s171 a signal indicative of a state corresponding to the delay state information s169, a downstream path memory circuit 169 to store decoded bits on survivor paths in each state and output most likely and merging path input information s173 and decoded bit s174, and a likelihood update circuit 170 to update the likelihood of the decoded bit and output a logarithmic likelihood ratio s175. Supplied with a received value Yt and a priory probability information log Pr(it=0) and log Pr(it=1) as s161, the two-step SOVA decoder 160 outputs the decoded data s174 and logarithmic likelihood ratio s175. It should be reminded here that the terminating length of the upstream path memory circuit 165 is indicated with D and that of the downstream path memory circuit 169 is with U.

Supplied with the received value and a priory probability information s161, the branch-metric computation circuit 161 computes a branch-metric of the received data and outputs the result of the computation as branch-metric signal s162 to the ACS circuit 162.

Based on the branch-metric signal s162 supplied from the branch-metric computation circuit 161 and state-metric signal s165 supplied from the state-metric memory circuit 164, the ACS circuit 162 adds a branch-metric and state-metric to each of two paths merging into a state for comparison of the paths, selects a more likely one of the paths based on the result of the comparison and takes it as a new state-metric. The ACS circuit 162 outputs the selected path as path selection information s166 to the upstream path memory circuit 165 and path selection information delay circuit 166. Also, the ACS circuit 162 outputs a metric difference found when a path is selected in each state as metric difference information s167 to the metric difference delay circuit 167. Further, the ACS circuit 162 outputs a number for a state having a minimum state-metric as most likely state signal s168 to the upstream path memory circuit 165 and the newly obtained state-metric as new state-metric signal s163 to the nonnalization circuit 163.

The nonnalization circuit 163 subtracts a minimum state-metric, for example, from the new state-metric signal s163 output from the ACS circuit 162 to nonnalize the new state-metric signal s163 to a value within a preset range, and outputs it as normalized state-metric signal s164 to the state-metric memory circuit 164.

The state-metric memory circuit 164 stores the normalized state-metric signal s164 supplied from the nonnalization circuit 163 and feeds it as state-metric signal s165 back to the ACS circuit 162

Based on the path selection information s166 output from the ACS circuit 162, the upstream path memory circuit 165 stores decoded bits on survivor paths in each state, and outputs, based on the most likely state signal s168 output from the ACS circuit 162, numbers of the states counted back over the terminating length D from the most likely path as delay state information s169 to the selection circuit 168 and downstream path memory circuit 169.

The path selection information delay circuit 166 is provided to delay the path selection information s166 output from the ACS circuit 162 by the terminating length D of the upstream path memory circuit 165 and output it as path selection information delay signal s170 to the downstream path memory circuit 169.

The metric difference delay circuit 167 delays the metric difference information s167 output from the ACS circuit 162 by the terminating length D of the upstream path memory circuit 165, and outputs it as metric difference delay signal s171 to the selection circuit 168.

Based on the delay state information s169 supplied from the upstream path memory circuit 165 and metric difference delay signal s171 supplied from the metric difference delay circuit 167, the selection circuit 168 selects a signal indicative of a state corresponding to the delay state information s169 from the metric difference delay signal s171, and outputs it as metric difference delay select signal s172 to the likelihood update circuit 170.

Based on the path selection information delay signal s170 supplied from the path selection information delay circuit 166, the downstream path memory circuit 169 stores decoded bits on survivor paths in each state. Also, based on the delay state information s169 output from the upstream path memory circuit 165, the downstream path memory circuit 169 outputs, as decoded bit s174, information further counted back over an terminating length U from the most likely path. Based on the delay state information s169, the downstream path memory circuit 169 outputs input information corresponding to the most likely path and input information corresponding to paths merging into the most likely path, only for the terminating length, respectively, as most likely and merging path input information s173 to the likelihood update circuit 170.

The likelihood update circuit 170 updates input information corresponding to the most likely path, that is, the likelihood of the decoded bit, based on the metric difference delay select signal s172 supplied from the selection circuit 168 and the most likely and merging path input information s173 supplied from the downstream path memory circuit 169, and outputs, as a logarithmic likelihood ratio s175, likelihood information the terminating length U before the downstream path memory circuit 169.

As in the above, the blocks of the two-step SOVA decoder 160, including the branch-metric computation circuit 161 to the upstream path memory circuit 165, are architected quite identically to those in the conventional Viterbi decoder 140 having previously been described with reference to FIG. 6.

The downstream path memory circuit 169 and likelihood update circuit 170 will be described below with reference to FIGS. 11 to 13. In the downstream path memory circuit 169, memory cells $MS_B$ to store decoded bits, shown in FIG. 7, are disposed similarly to those in the conventional Viterbi decoder 140 to shift information bits corresponding to survivor paths in each state based on the path selection information delay signal s170, and information bits are supplied from all the memory cells $MS_B$ to store the decoded bits to a selection circuit (not shown), thus providing input information corresponding to the most likely path and input bits corresponding to paths merging in the most likely path as most likely and merging path input information s173 to the likelihood update circuit 170 based on the delay state information s169 output from the upstream path memory circuit 165. When the constraint length is 3, the memory cells $MS_B$ provided in the downstream path memory circuit 169 to store the decoded bits and selection circuit are disposed as shown in FIG. 11.

On the other hand, the likelihood update circuit 170 include memory cells $MS_P$ to store the likelihood information, architected as shown in FIG. 12. That is, each of the memory cell $MS_P$ includes a decision circuit 171 supplied with most likely path input information b1 and merging path input information b2, based on the most likely and merging path input information s173 supplied from the downstream path memory circuit 169, and also with a metric difference Δ1 based on the metric difference delay select signal s172 supplied from the selection circuit 168 and likelihood information Δ2 supplied from the memory cell $MS_P$ to store the preceding likelihood information, to judge whether the most likely input information b1 and merging path input information b2 are in a relation that b1≠b2 and whether the metric difference Δ1 and likelihood information Δ2 are in a relation that Δ1<Δ2, a selector 172 to select the metric difference Δ1 when the decision circuit 171 has decided that b1≠b2 and Δ1<Δ2, and the likelihood information Δ2 in other cases, and a register 173 to store the metric difference or likelihood information selected by the selector 172.

In the likelihood update circuit 170, the memory cells $MS_P$ to store the likelihood information are disposed in an array as shown in FIG. 13, to update only the likelihood for an input bit corresponding to the most likely path determined by the upstream path memory circuit 165 for the terminating length U of the downstream path memory circuit 169, and output the likelihood information being a result of the updating as a logarithmic likelihood ratio.

The two-step SOVA decoder 160 is adapted to determine a to-be-decoded most likely path by tracing back paths for a sufficiently long time, that is, an terminating length D, from a most likely state at a time t as shown in FIG. 14. With the metric difference and path selection information having been delayed, the two-step SOVA decoder 160 will be able to update the likelihood of only the most likely path through comparison between paths merging in the most likely path and the most likely path at a time t-D.

Since a smaller terminating length U of the downstream path memory circuit 169 than the terminating length D of the upstream path memory circuit 165 will do as disclosed in "Berrou, Adde, Angui and Faudeil—A Low Complexity Soft-Output Viterbi Decoder Architecture, in Proc. IEEE Int. Conf Coimmun., Geneva, Switzerland, May 1993, pp. 737–740", the two-step SOVA decoder 160 can be embodied at a circuit scale for the same code, approximately double that of the conventional Viterbi decoder 140 shown in FIG. 6 even if the delay memory is included.

The conventional Viterbi decoder 140 has the path memory circuits thereof formed from register arrays as in the SOVA decoder 110, for example (this will be referred to as "register shift method" hereinafter). Recently, however, a method of decoding by storing path selection information in a RAM (random-access memory) and tracing the information (will be referred to as "trace-back method" hereinafter) has been researched. The trace-back method will be discussed herebelow:

For operation of the Viterbi decoder at a high speed, only one access is possible to the RAM at every clock. The operation of the path memory circuit to decode by one access to each RAM will be described concerning the use of four single-port memories as disclosed in "Edwards—A 45-Mbits/sec. VLSI Viterbi Decoder for Digital Video Applications, IEEE NatI. Telesystems Conf Vol. 1993, pp. 127–130".

First, there are provided four single-port RAMs each having a number of bits for a number of states and a number of words for an terminating length. Path selection information for the number of states is supplied at every clock from the ACS circuit to the path memory circuit. As shown in FIG. 15, the four RAMs have the following functions thereof switched from one to another at every clock for the terminating length.

The function of the first RAM is to write path selection information as shown in FIG. 15, that of the second RAM is to trace based on the written path selection information without decoding as shown in FIG. 15B, that of the third RAM is to wait without access as shown in FIG. 15C, and that of the fourth RAM is to trace based on the result of tracing and output decoded bits as shown in FIG. 15D. That is, the four RAMs have their respective functions switched from one to another at every clock for the terminating length.

With these functions of the RAMs, the Viterbi decoder can provide a high-speed decoding. Since decoded bits determined by tracing based on the result of tracing are in a sequence opposite to the original time series of them, however, in the Viterbi decoder, the sequence of the decoded bits is corrected with the Last-in First-out (LIFO) operation to the original one before they are output.

In the Viterbi decoder using the aforementioned traceback method, the circuit scale can be considerably reduced in comparison with that when the register-shift method is adopted in the Viterbi decoder since the RAMs will need a considerably smaller area than that the registers need when the code constraint length and decoding terminating length are increased.

However, the downstream path memory circuit of the two-step SOVA decoder has to read all input information bits for the terminating length at the same time while each of the RAMs operating at a high speed can be accessed only once per clock. Therefore, it is difficult to form the path memory circuit of the two-step SOVA decoder from RAMs.

Since the conventional two-step SOVA decoder adopts the register-shift method, the circuit scale will be very large when the code constraint length and decoding terminating length are increased, so long as the register array is used to form the path memory circuit.

OBJECT AND SUMMARY OF THE INVENTION

It is therefore an object of the present invention to overcome the above-mentioned drawbacks of the prior art by providing a decoding method and apparatus to implement a SOVA decoder whose circuit scale is small and can operate at a high speed even when the code constraint length and decoding terminating length are large.

The above object can be attained by providing, according to the present invention, a decoding method of decoding, in the soft-output Viterbi manner, an input convolutional code to provide a decoded data and likelihood information, including steps of:

storing, into a random-accessible path selection information storing means, path selection information indicative of more likely paths selected at each transition of the convolutional code;

storing, based on a trace result signal indicative of a result of a tracing effected for a terminating length based on the path selection information, a result of tracing of a most likely path being a sequence most likely to that of the convolutional code into a trace result storing means;

selecting, based on a delayed trace result signal indicative of a result of tracing of the most likely path stored in the trace result storing means and thus delayed, a metric difference for the most likely path from a metric difference delay signal resulted from a delay of the metric difference when the more likely paths are selected at each transition of the convolutional code, and storing it into a metric difference storing means;

storing, based on the delayed trace result signal and a delayed most likely metric difference signal indicative of a metric difference for the most likely path stored in the metric difference storing means, a minimum value of the metric difference for the most likely path into a minimum value storing means at each transition of the convolutional code; and acquiring the likelihood information based on the minimum value.

Since the minimum value of the metric difference is stored into the minimum value storing means at each transition of the convolutional code, the above decoding method according to the present invention makes it unnecessary to read all input convolutional codes for the terminating length at the same time for acquisition of the likelihood information, and enables to store the path selection information into the random-accessible path selection information storing means. Therefore, the decoding method according to the present invention implements the trace-back method in which the path selection information stored in the random-accessible path selection information storing means is traced. Thus, even if the code constraint length and decoding terminating length are larger than in the conventional register-shift method, the decoding can be done at a high speed and with a small circuit scale.

Also the above object can be attained by providing, according to the present invention, a decoder for decoding, in the soft-output Viterbi manner, an input convolutional code to provide a decoded data and likelihood information, including:

means for storing, into a random-accessible path selection information storing means, path selection information indicative of more likely paths selected at each transition of the convolutional code;

means for storing, based on a trace result signal indicative of a result of a tracing effected for an terminating length based on the path selection information, a result of tracing of a most likely path being a sequence most likely to that of the convolutional code into a trace result storing means;

means for selecting, based on a delayed trace result signal indicative of a result of tracing of the most likely path stored in the trace result storing means and thus delayed, a metric difference for the most likely path from a metric difference delay signal resulted from a delay of the metric difference when the more likely paths are selected at each transition of the convolutional code, and storing it into a metric difference storing means; and means for storing, based on the delayed trace result signal and a delayed most likely metric difference signal indicative of a metric difference for the most likely path stored in the metric difference storing means, a minimum value of the metric difference for the most likely path into a minimum value storing means at each transition of the convolutional code; and the likelihood information being acquired based on the minimum value.

Since the minimum value of the metric difference is stored into the minimum value storing means at each transition of the convolutional code, the above decoder according to the present invention has not to read all input convolutional codes for the terminating length at the same time for acquisition of the likelihood information, and can store the path selection information into the random-accessible path selection information storing means. Therefore, the decoding method according to the present invention implements the trace-back method in which the path selection information stored in the random-accessible path selection information storing means is traced. Thus, even if the code constraint length and decoding-terminating length are larger than in the conventional register-shift method, the decoder can have a small circuit scale and provide a high-speed decoding.

These objects and other objects, features and advantages of the present intention will become more apparent from the following detailed description of the preferred embodiments of the present invention when taken in conjunction with the accompanying drawings.

BRIEF DESCRIPTION OF THE DRAWINGS

FIG. 15 explains the roles of four RAMs in the trace-back method;

DETAILED DESCRIPTION OF THE PREFERRED EMBODIMENTS

Figure 1:
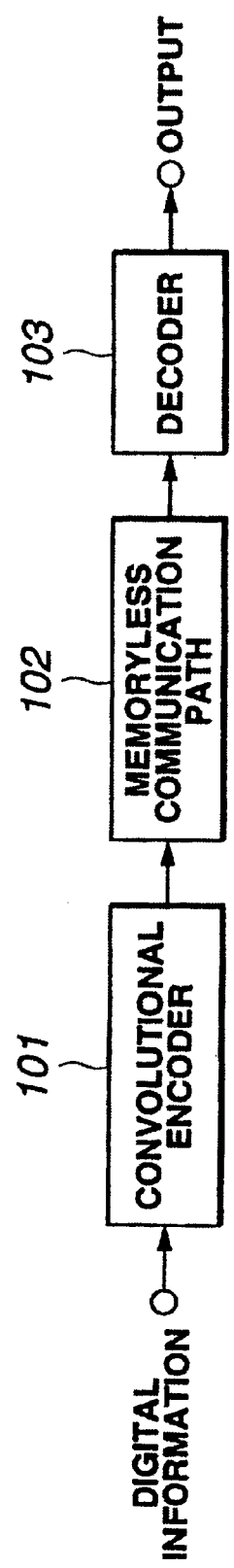
FIG. 1 is a block diagram of a communications model.
Figure 2:
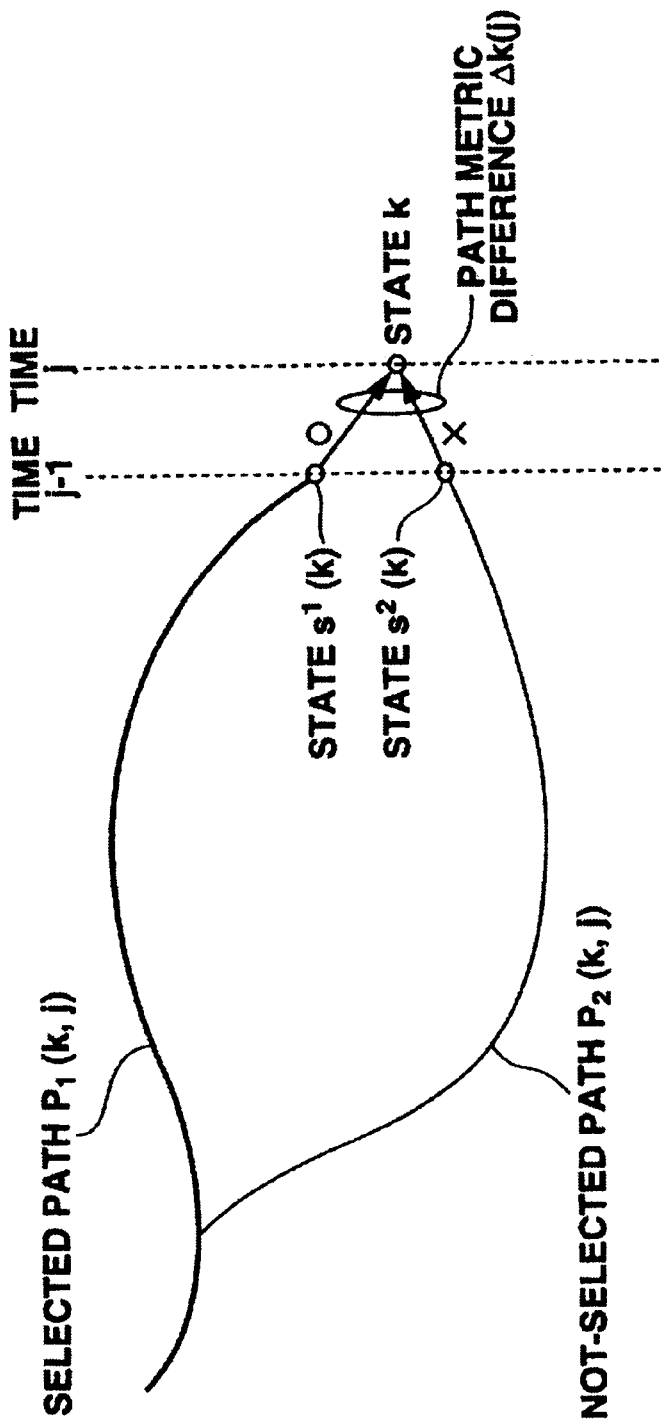
FIG. 2 explains the SOVA with which two paths merge together at a time j in a state k.
Figure 3:
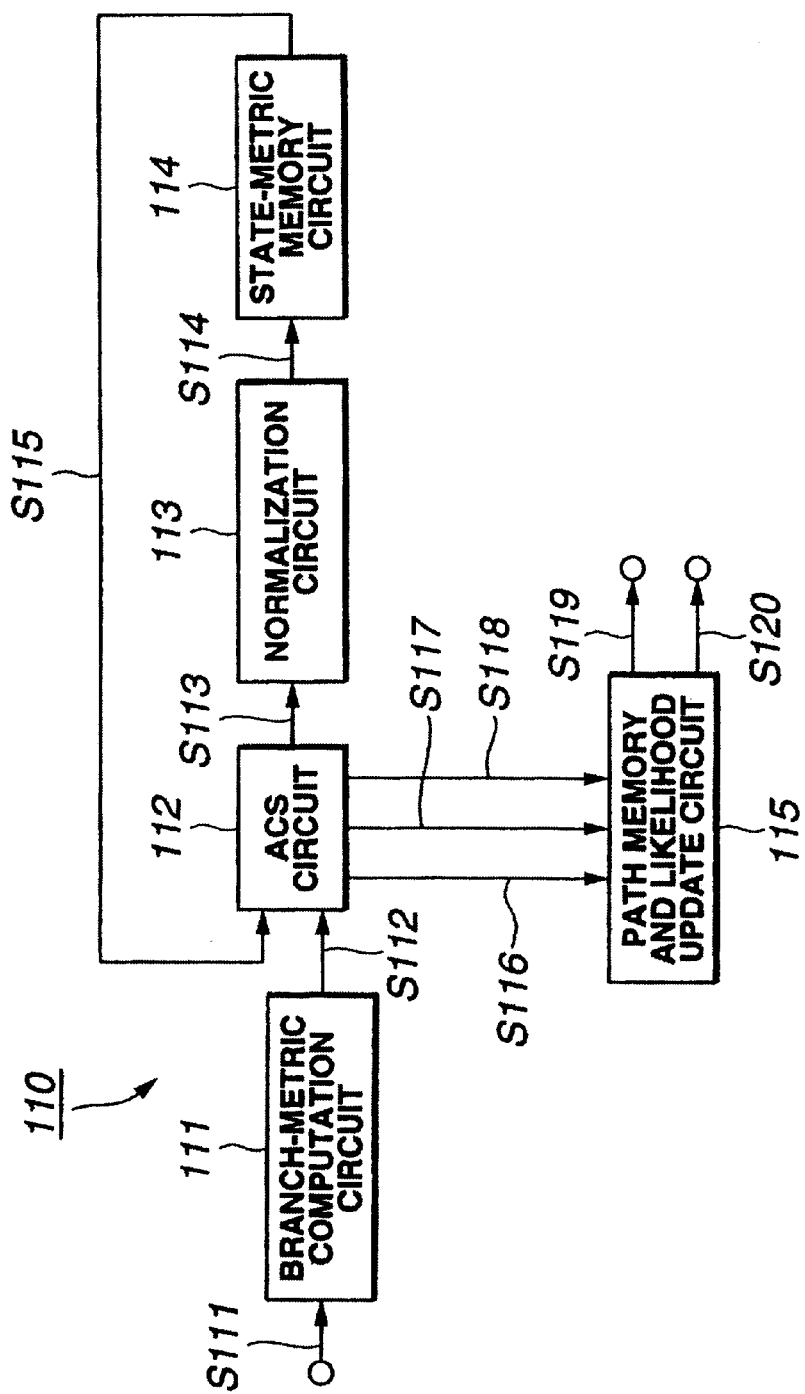
FIG. 3 is a block diagram of a conventional SOVA decoder.
Figure 4:
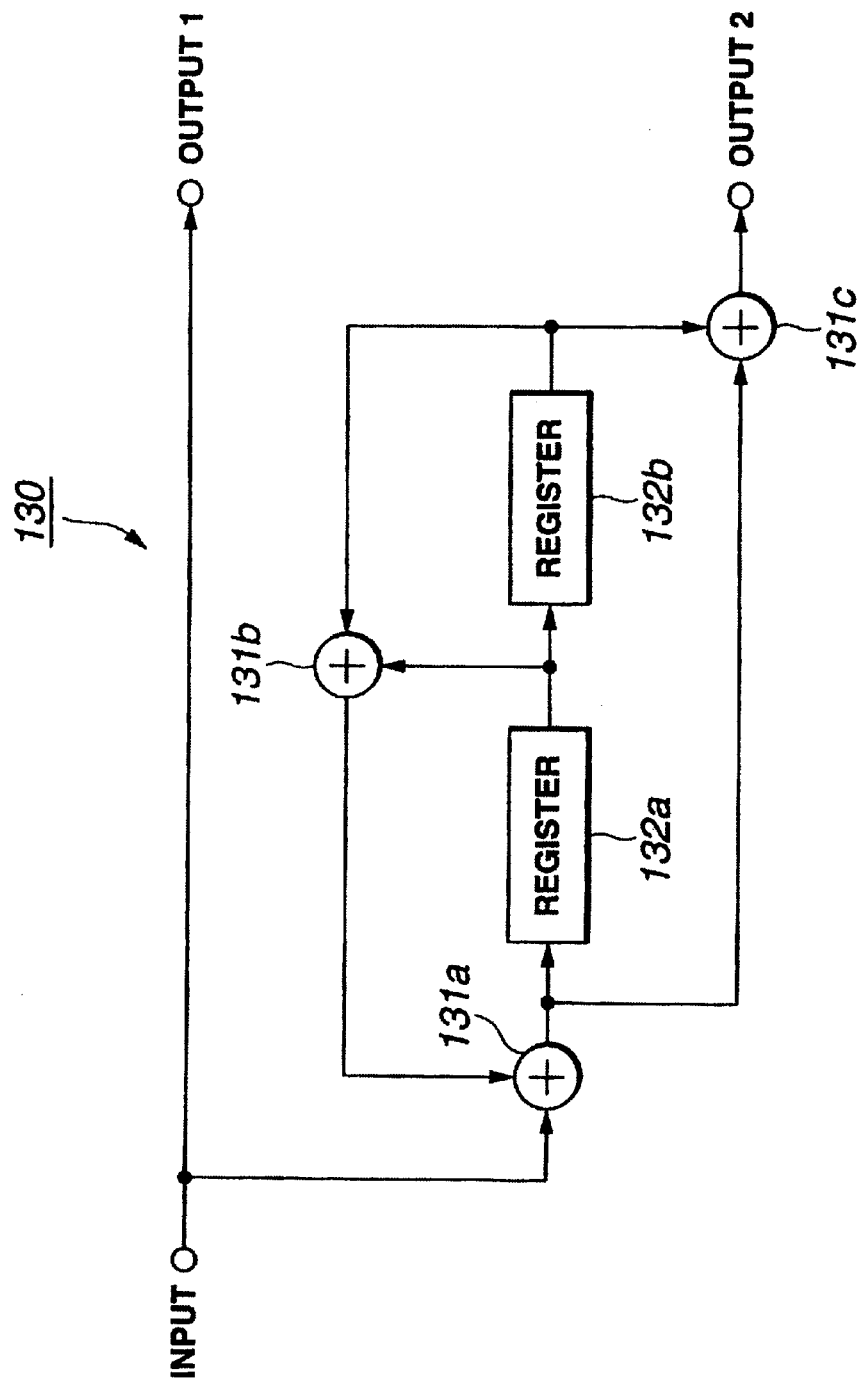
FIG. 4 is a block diagram of a convolutional encoder with a constraint length of 3.
Figure 5:
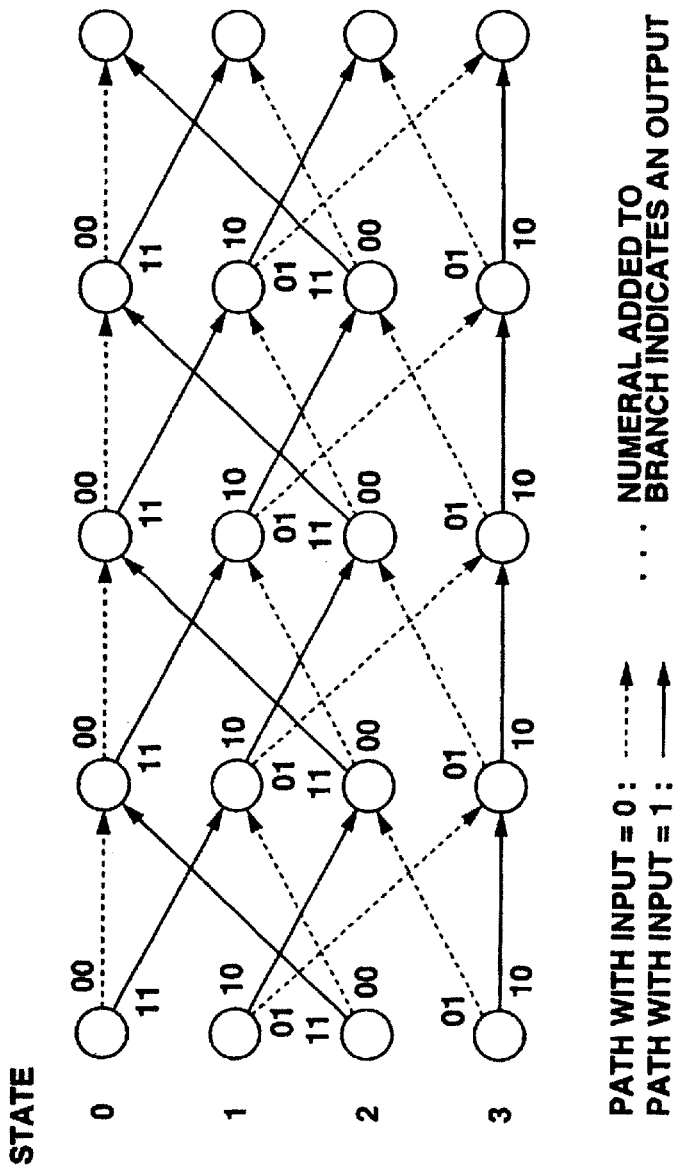
FIG. 5 explains the trellis of the convolutional encoder shown in FIG. 4.
Figure 6:
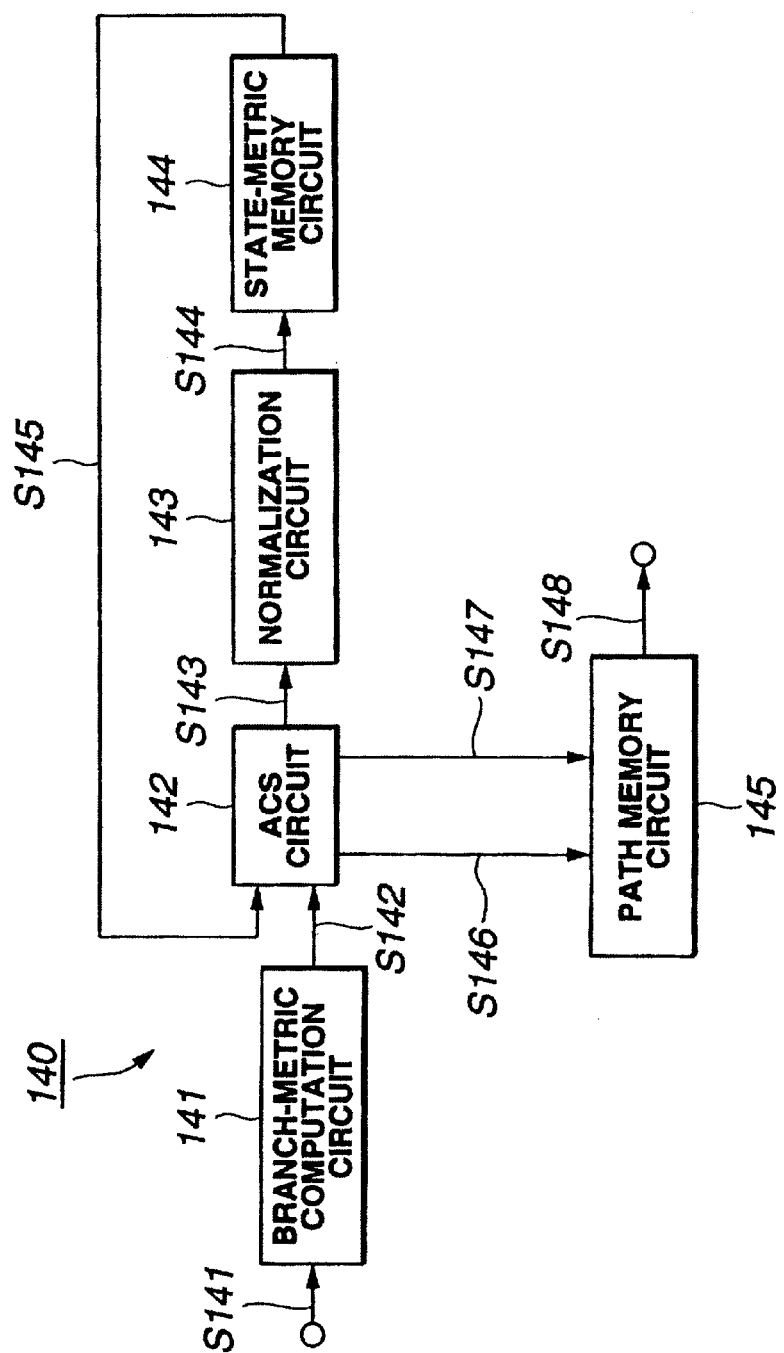
FIG. 6 is a block diagram of a conventional Viterbi decoder.
Figure 7:
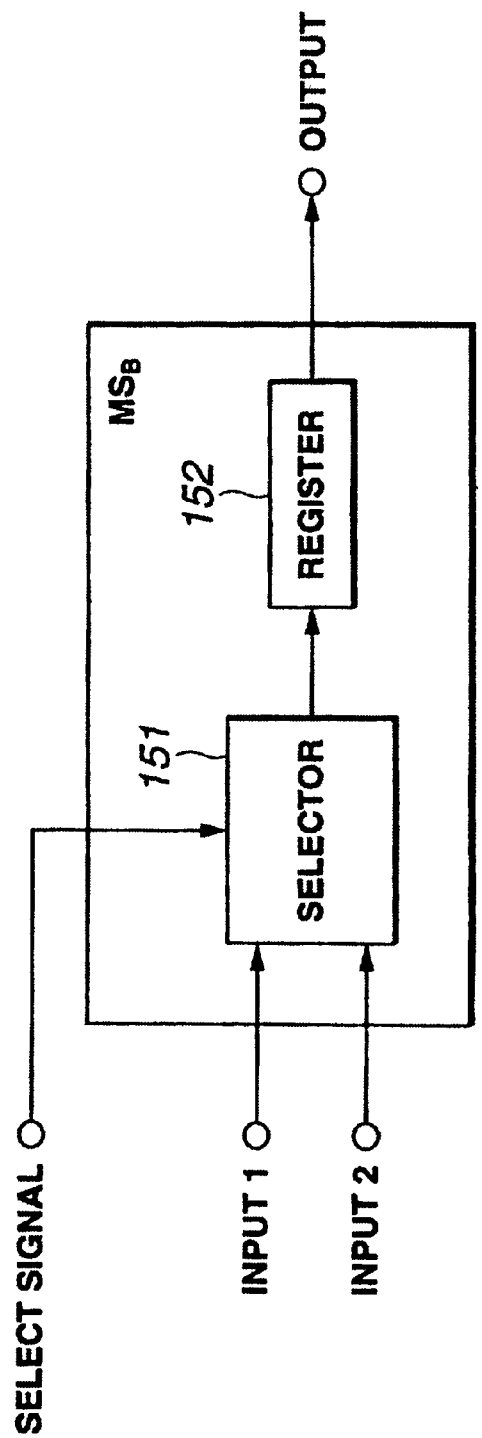
FIG. 7 is a block diagram of a memory cell to store a decoded bit.
Figure 8:
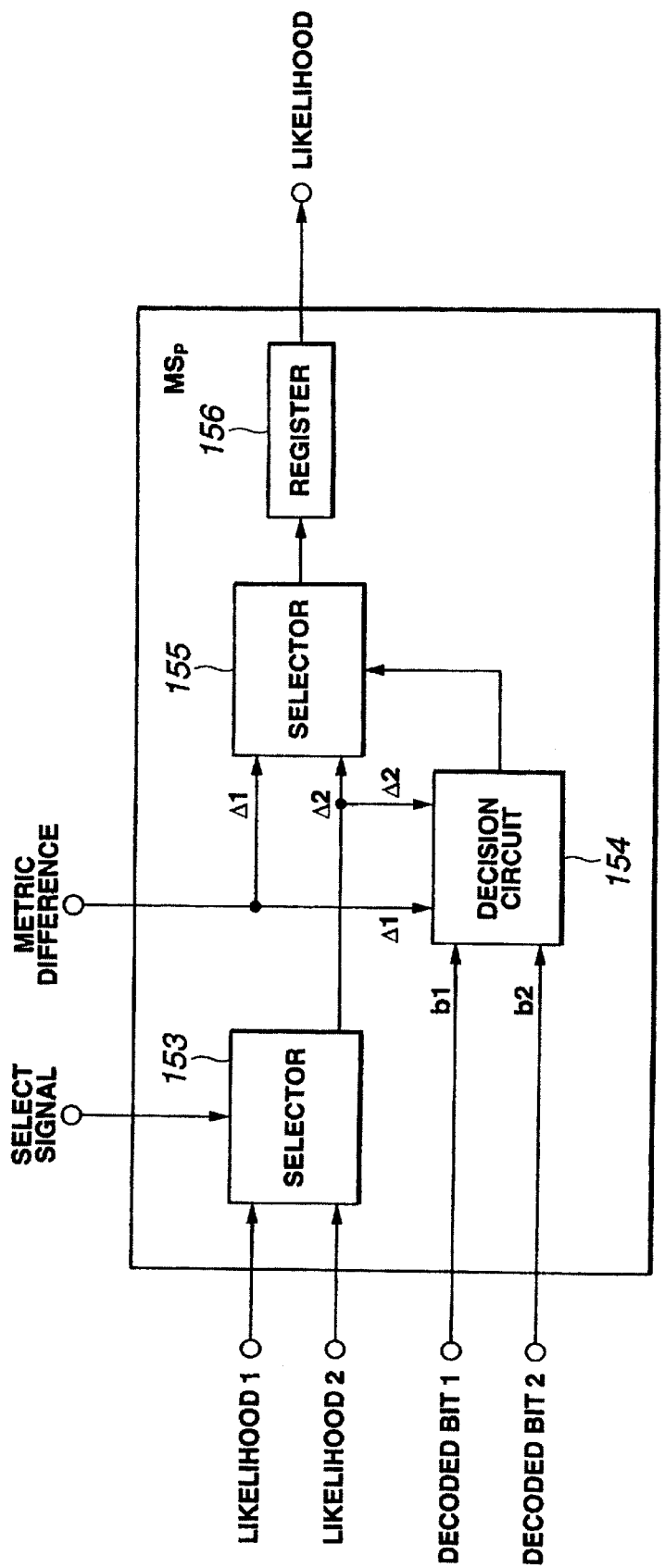
FIG. 8 is a block diagram of a memory cell to store likelihood information.
Figure 9:
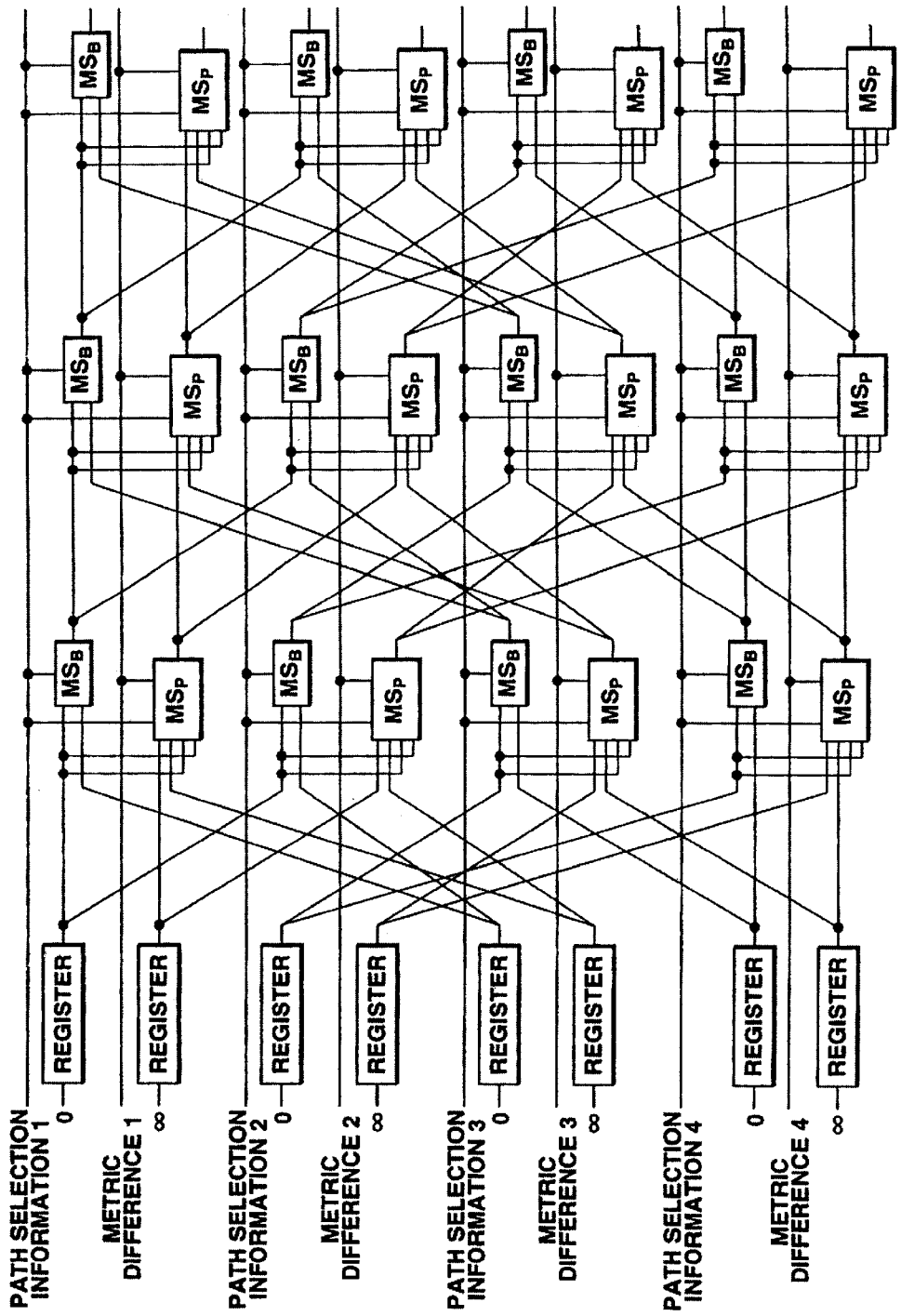
FIG. 9 explains an example construction of the memory cells shown in FIGS. 7 and 8 when the restraint length is 3.
Figure 10:
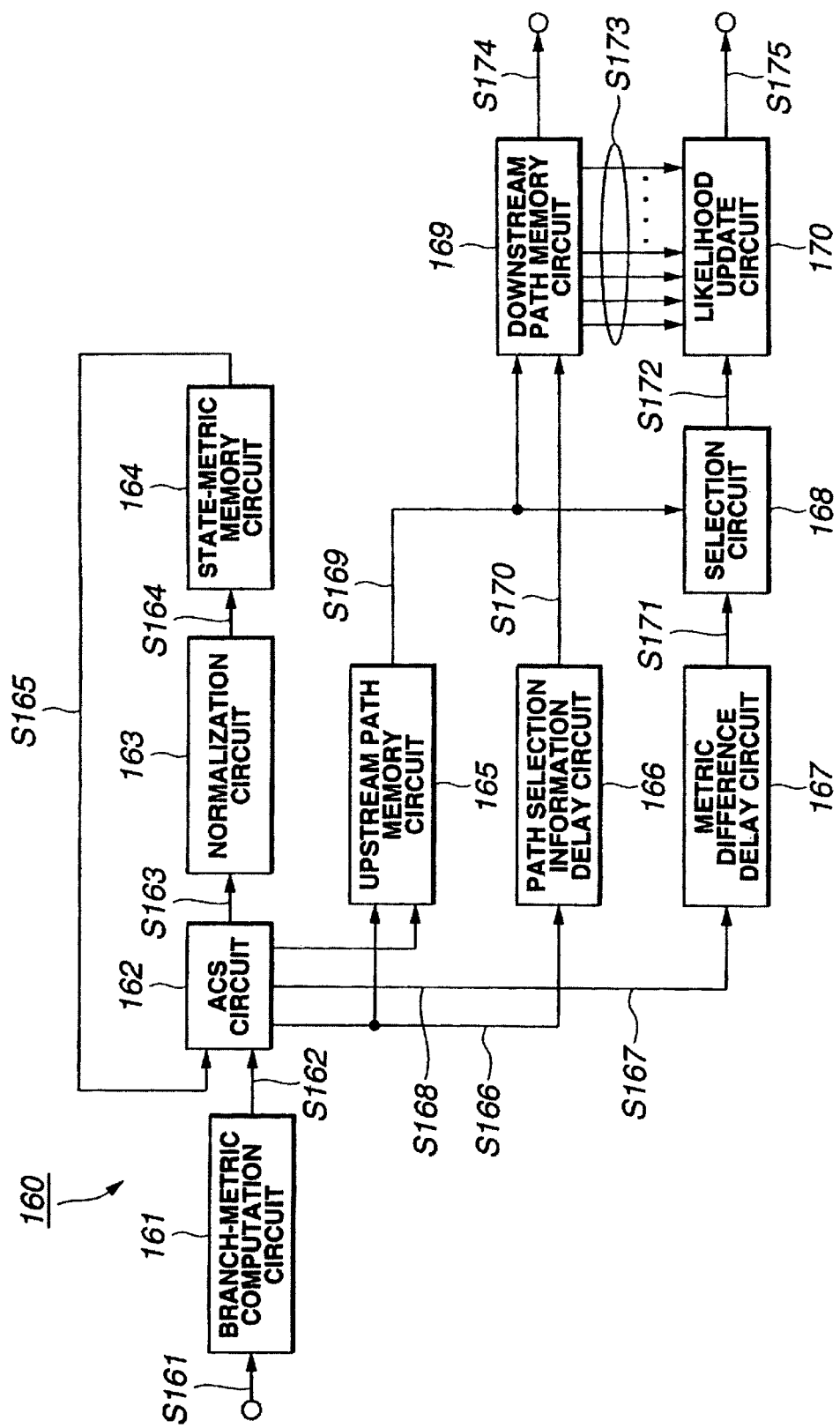
FIG. 10 is a block diagram of a conventional two-step SOVA decoder.
Figure 11:
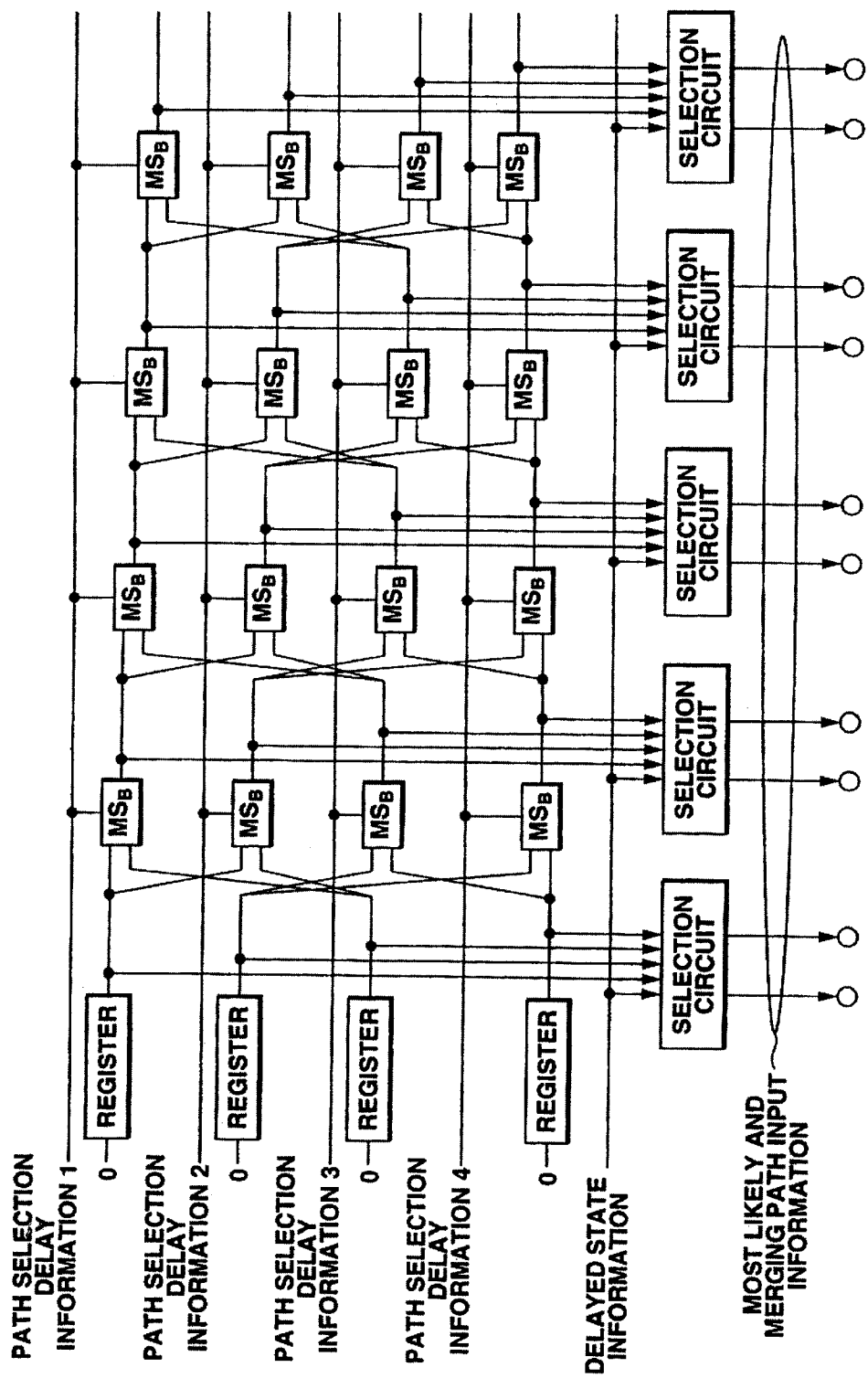
FIG. 11 explains an example construction of the memory cell to store a decoded bit when the constraint length is 3 and selection circuit in the conventional two-step SOVA decoder in FIG. 10.
Figure 12:
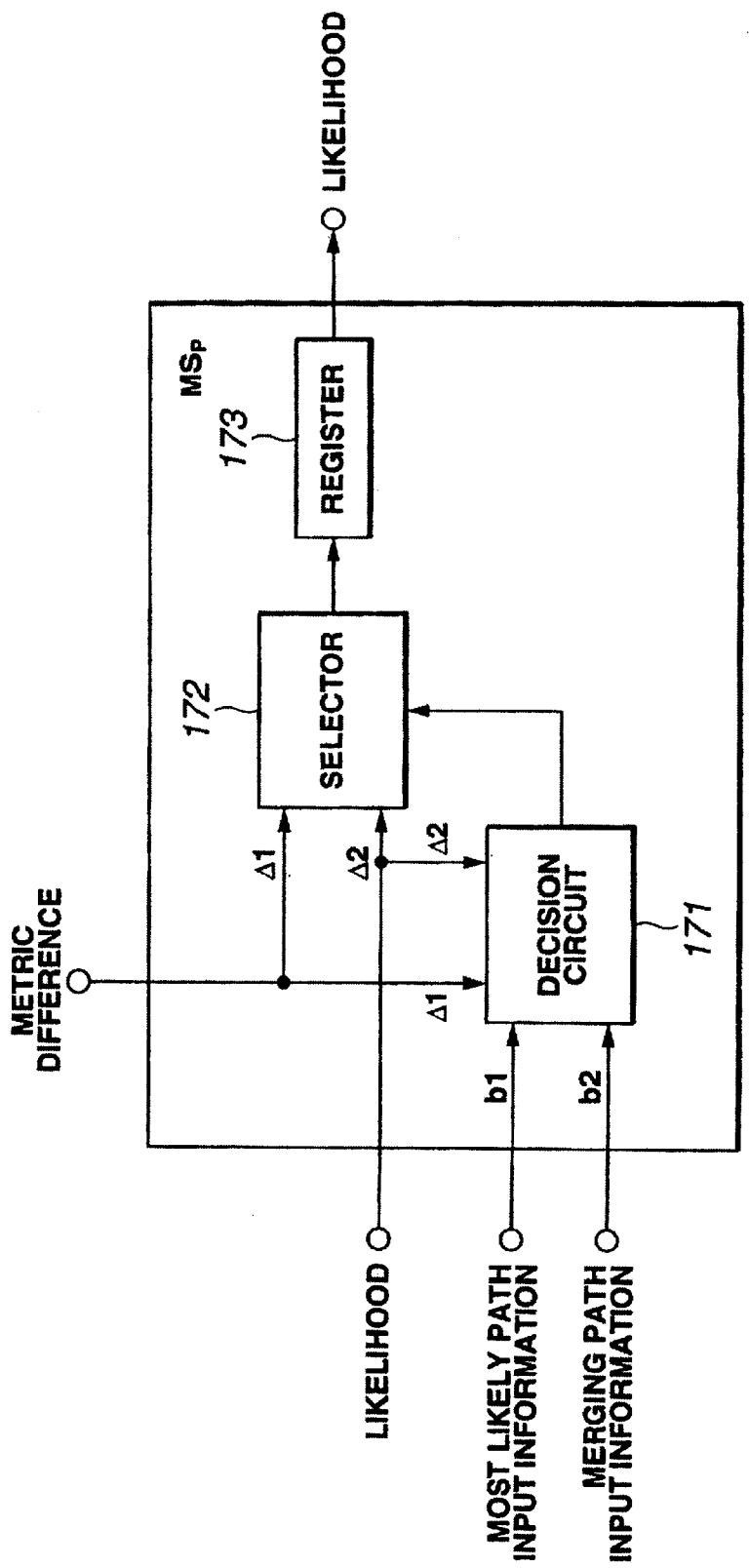
FIG. 12 is a block diagram of a memory cell provided in the conventional two-step SOVA decoder in FIG. 10 to store likelihood information.
Figure 13:
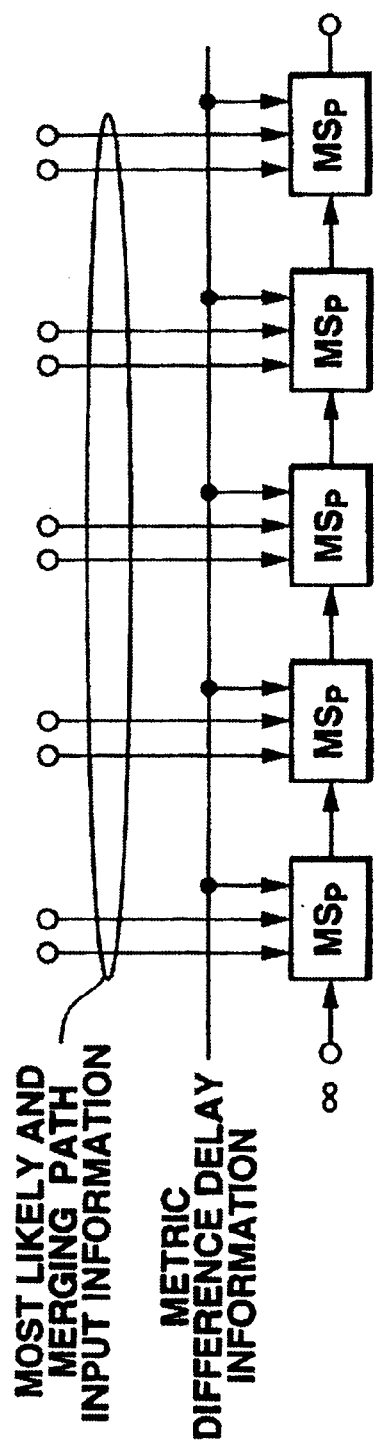
FIG. 13 is a block diagram of a likelihood update circuit provided in the conventional two-step SOVA decoder in FIG. 10.
Figure 14:
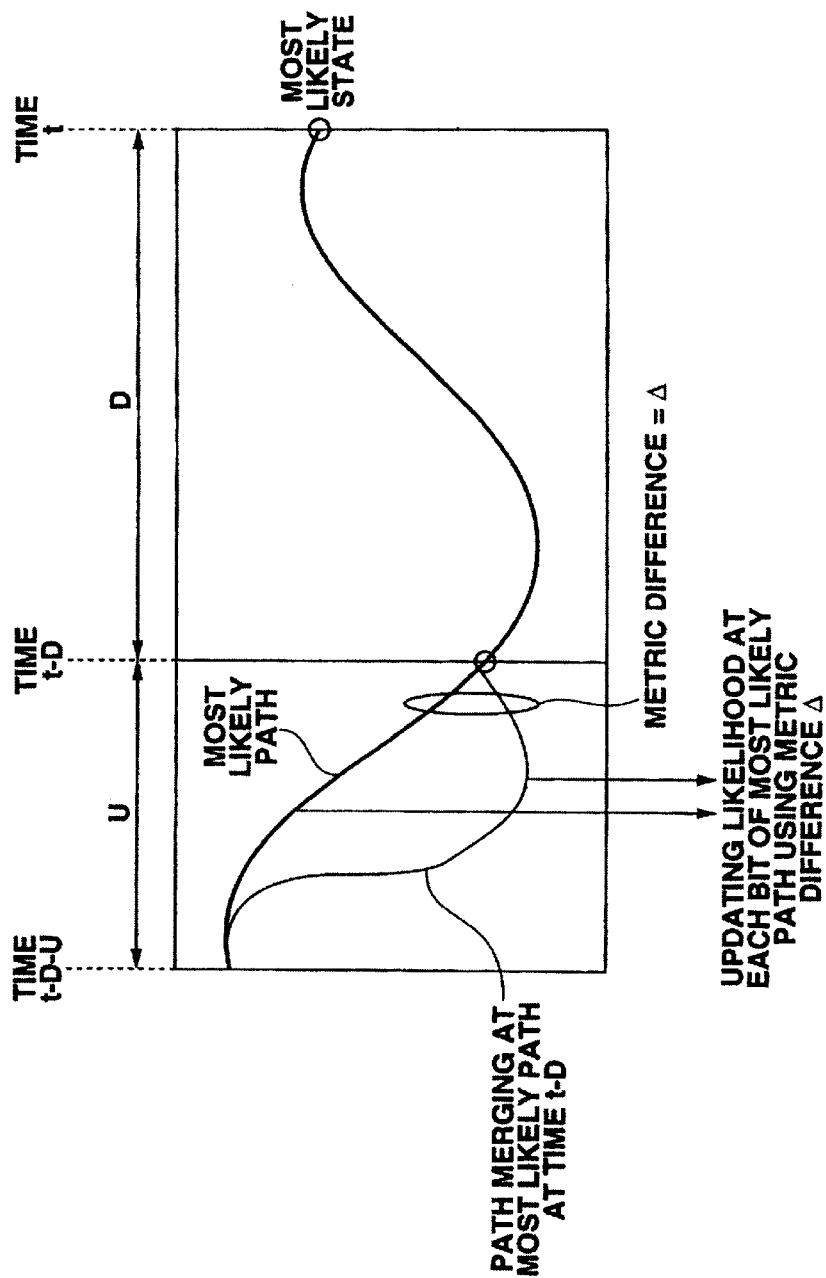
FIG. 14 explains the operations of the conventional two-step SOVA decoder in FIG. 10.
Figure 16:
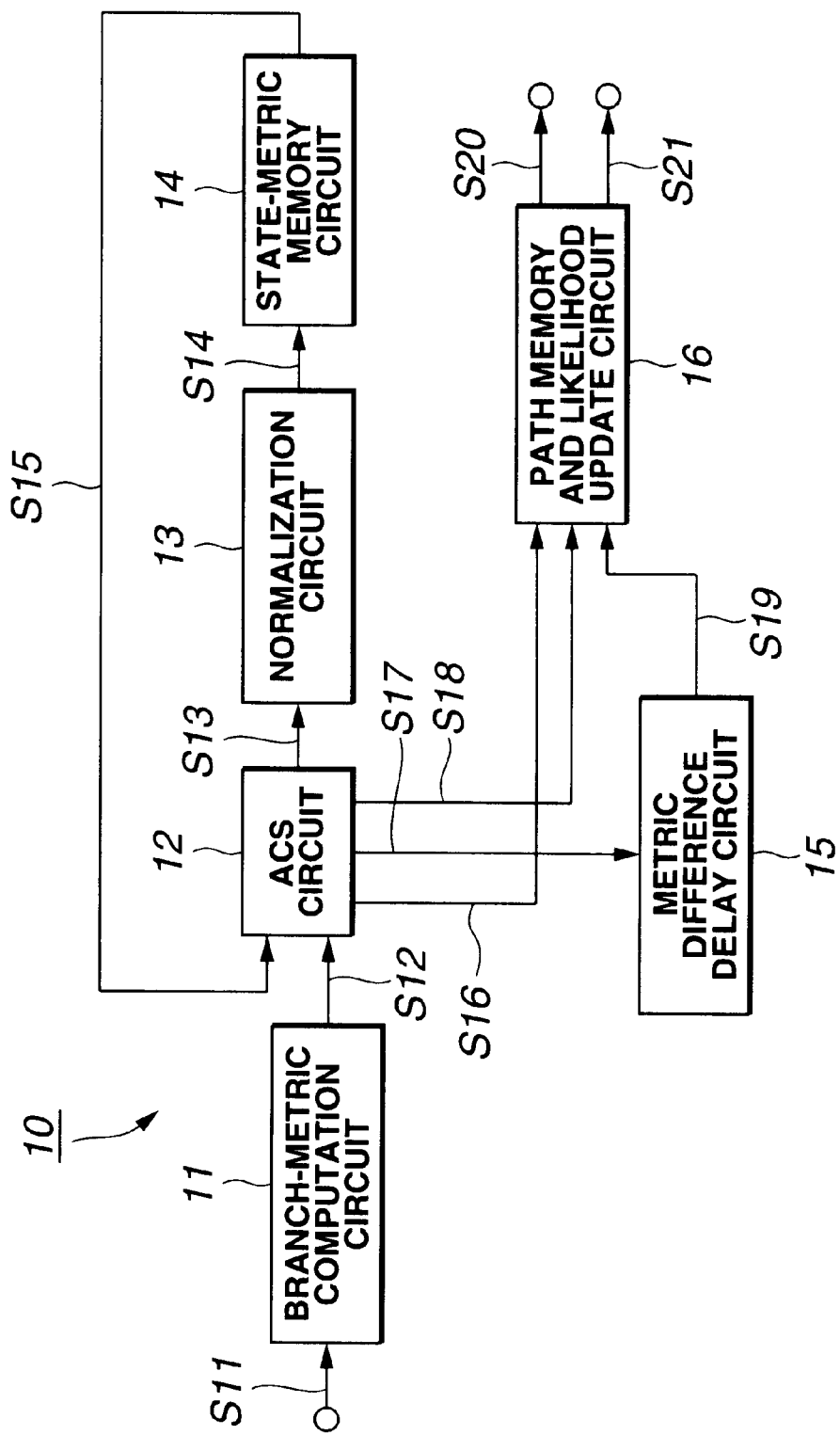
FIG. 16 is a block diagram of a two-step SOVA decoder according to the present invention.

Referring now to FIG. 16, there is illustrated in the form of a block diagram a two-step SOVA decoder according to the present invention, in which the two-step soft-output Viterbi algorithm (will be referred to as "two-step SOVA" hereinafter) is adopted. The two-step SOVA decoder is generally indicated with a reference 10.

Figure 17:
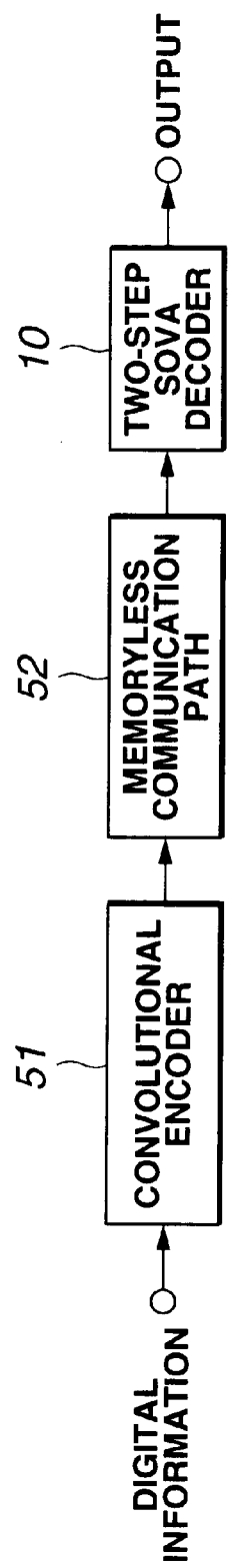
FIG. 17 is a block diagram of a communications model in which the two-step SOVA decoder in FIG. 16 is adopted.

FIG. 17 is a block diagram of a communications model in which the two-step SOVA decoder in FIG. 16 is adopted. As shown, the communications model includes a convolutional encoder 51, memoryless channel 52 and the two-step SOVA decoder 10. Digital information is encoded by the convolutional encoder 51 through convolutional coding, and an output from the convolutional encoder 51 is supplied to the two-step SOVA decoder 10 via the memoryless channel 52 with noises. The input digital information is decoded by the two-step SOVA decoder 10.

As shown in FIG. 16, the two-step SOVA decoder 10 includes a branch-metric computation circuit 11 to compute a branch-metric of a received data, an add compare select (ACS) circuit 12 to add a branch-metric and state-metric together for comparison, a normalization circuit 13 to normalize a new state-metric signal s13 output from the ACS circuit 12, a state-metric memory circuit 14 to store a nonnalized state-metric signal s14 output from the normalization circuit 13, a metric difference memory circuit 15 to delay a metric difference information s17, and a path memory and likelihood update circuit 16 to output a decoded data s20 and logarithmic likelihood ratio s21. Thus, supplied with a received value Yt and a priory probability information log Pr(it=0) and log Pr(it=1) as s11, the two-step SOVA decoder 10 will output the decoded data s20 being a result of decoding and the logarithmic likelihood ratio s21.

Supplied with the received value and a priory probability information s11, the branch-metric computation circuit 11 computes a branch-metric of the received data and outputs a result of this computation as branch-metric signal s12.

Based on the branch-metric signal s12 supplied from the branch-metric computation circuit 11 and state-metric signal s15 supplied from the state-metric memory circuit 14, the ACS circuit 12 adds the branch-metric and state-metric to two paths merging into a state (transition) for comparison, selects a more likely one of the paths based on a result of the comparison, and takes it as a new state-metric. The ACS circuit 12 outputs the selected path as path selection information s16 to the downstream path memory and likelihood update circuit 16. Also, the ACS circuit 12 outputs to the downstream metric difference delay circuit 15 a metric difference when a path is selected in each state as metric difference information s17. Moreover, the ACS circuit 12 outputs a number of a state having a minima state-metric as most likely state signal s18 to the downstream path memory and likelihood update circuit 16. In addition, the ACS circuit 12 outputs to the downstream normalization circuit 13 a newly acquired state-metric as new state-metric signal s13.

The normalization circuit 13 subtracts a minimum state-metric, for example, from the new state-metric signal s13 output from the ACS circuit 12 to nonnalize the new state-metric signal s13 to a value within a preset range, and outputs it as normalized state-metric signal s14 to the downstream state-metric memory circuit 14.

The state-metric memory circuit 14 stores the nonnalizer state-metric signal s14 supplied from the nonnalization circuit 13 and feeds it as the state-metric signal s15 back to the ACS circuit 12.

Assuming that the terminating length of the upstream path-method circuit in the two-step SOVA decoder 10 is D, the metric difference delay circuit 15 will delay the metric difference information s17 output from the ACS circuit 12 by 4D, and outputs it as metric difference delay signal s19 to the downstream path memory and likelihood update circuit 16.

The path memory and likelihood update circuit 16 stores decoded bits of survivor paths in each state based on the path selection information s16 output from the ACS circuit 12 while updating the likelihood of the decoded bits of the most likely path using the metric difference delay information s19 output from the metric difference delay circuit 15. Also, the path memory and likelihood update circuit 16 outputs the decoded data s20 and logarithmic likelihood ratio s21 based on the most likely state signal s18 output from the ACS circuit 12.

In the two-step SOVA decoder 10, since the path memory and likelihood update circuit 16 stores a minimum value of the metric difference Δ from the most likely path in each state, so RAMs (random access memory) can be adopted. This concept will further be described below with reference to FIGS. 18 to 21.

Figure 18:
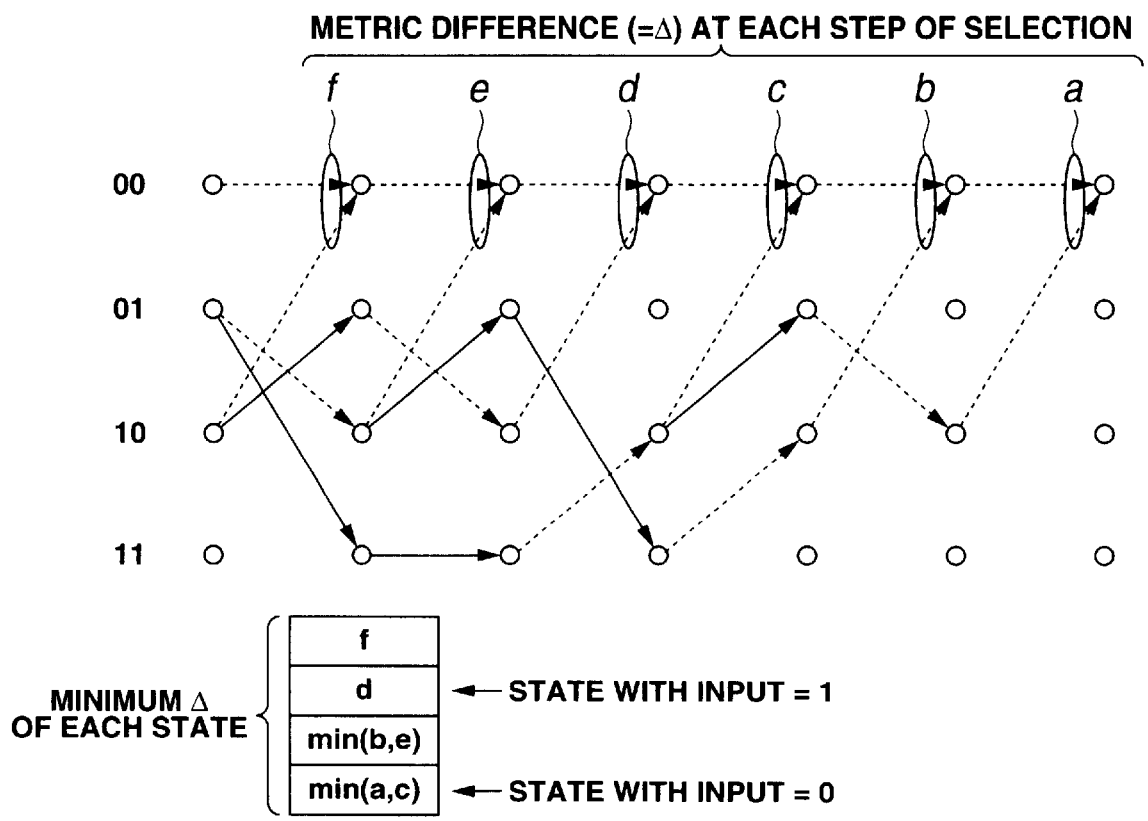
FIG. 18 explains the trellis when a code whose constraint length is 3 is decoded with an terminating length of 5.

The transition diagram (will be referred to as "trellis" hereinafter) used for decoding a code whose constraint length is 3 with an terminating length of 5 is as shown in FIG. 18. It is assumed here that the most likely path is a one whose bits are all zeros (0). To acquire a soft-output SOVA at a time t in this trellis, it is necessary to acquire a minimum value of the metric difference Δ of a path for which the input at the time t is 1. In this case, it is necessary to acquire a minimum value min (a, c, d) of a, c and d. If the minimum value of the metric difference Δ in each state at the time t is stored in the register, a soft-output to be acquired is provided by selecting a minimum value from states for which the inputs is 1 at the time t based on the value in the register. Therefore, in this case, the minimum value min(a, c, d) can be acquired by selecting minimum values of the contents d and min (a, c) corresponding to the states 01 and 11.

Figure 19:
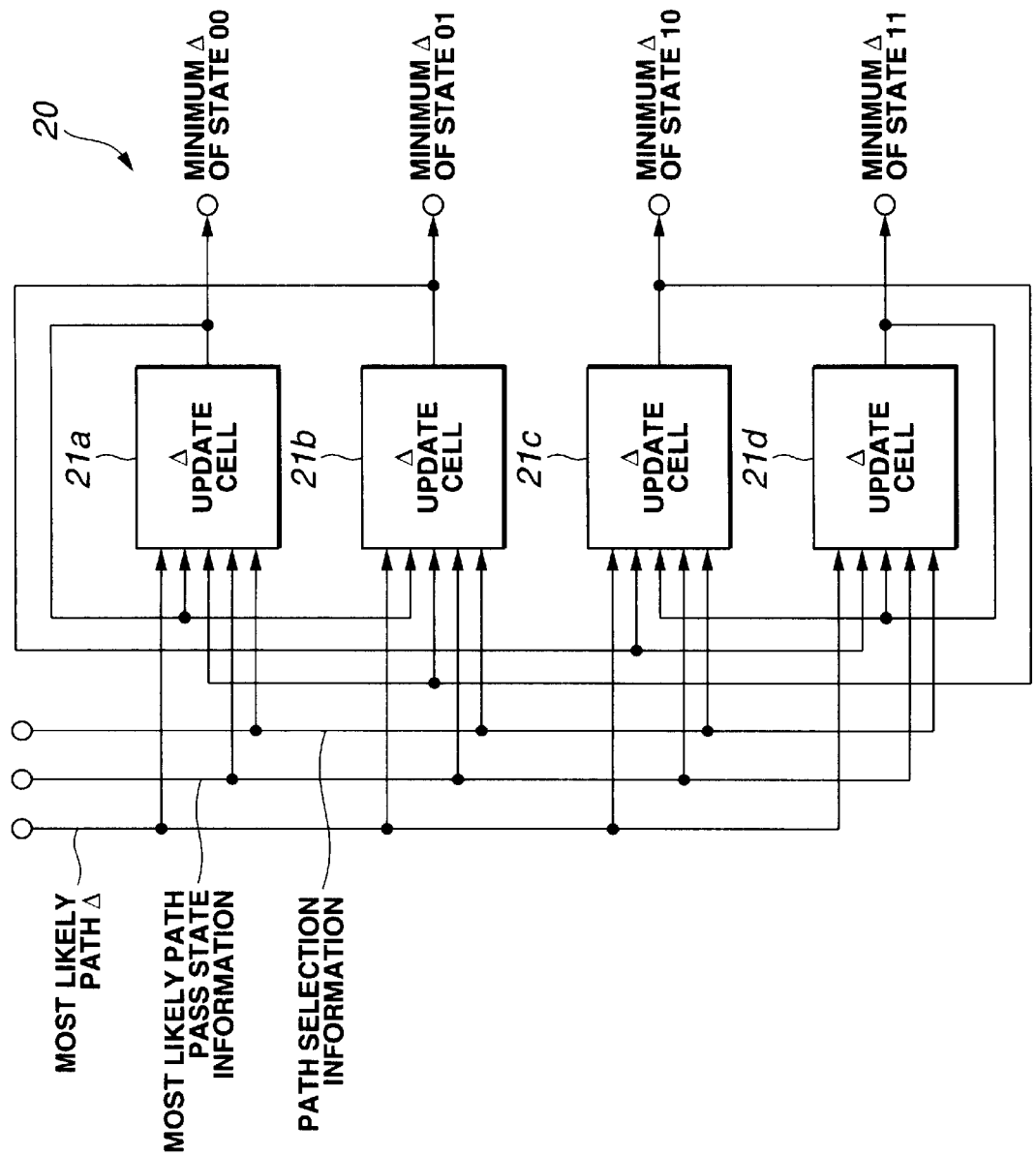
FIG. 19 is a block diagram of the minimum metric difference ($\Delta$) memory circuit.
Figure 20:
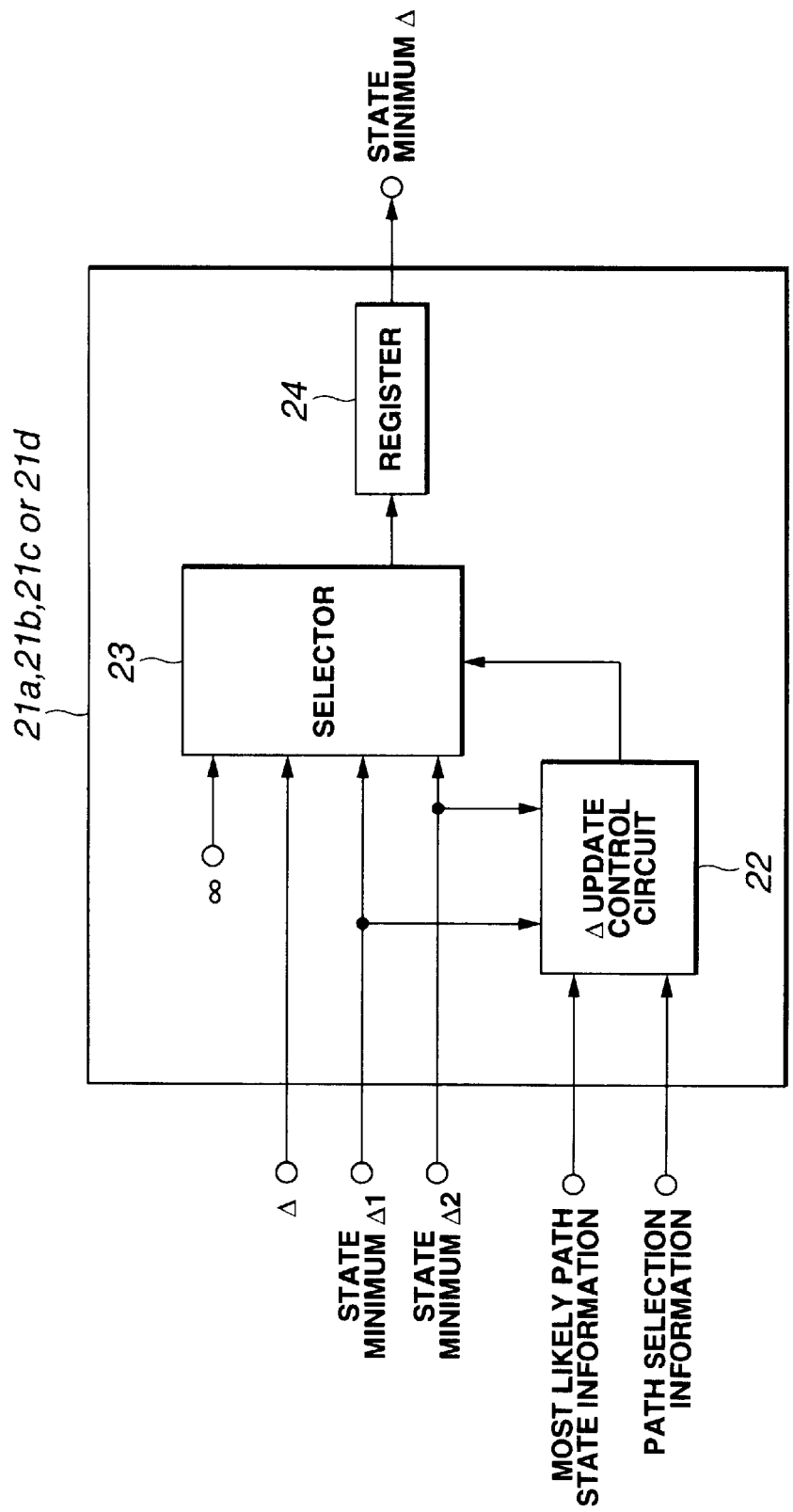
FIG. 20 is a block diagram of the metric difference ($\Delta$) update cell.

A circuit to store minimum values of the metric difference Δ in each state and update them one after another in an order contrary to the time-series order can be implemented as shown in FIGS. 19 and 20 by taking the trellis connection in consideration. This is a minimum metric difference (Δ) memory circuit 20 to store minimum values, as shown in FIG. 19.

As shown in FIG. 19, the minimum metric difference (Δ) memory circuit 20 includes metric difference (Δ) update cells 21a, 21b, 21c and 21d to update the metric difference. The update cells 21a to 21d store minimum values of states 00, 01, 10 and 11, respectively. In the following description, the states to which the metric difference (Δ) update cells 21a to 21d correspond, respectively, will be referred to as "cell-corresponding states", respectively.

Each of the update cells 21a to 21d in the minimum metric difference (Δ) memory circuit 20 includes a metric difference (Δ) update control circuit 22, selector 23 and register 24 as shown in FIG. 20. In FIG. 20, the metric difference Δ is a metric difference between the most likely path and paths existing concurrently and merging into the most likely path, and Δ1 and Δ2 indicate minimum values, respectively, of the metric difference so far stored in the metric difference (Δ) update cells for two states (will be referred as "possible states" hereafter) contiguous from the states to which the cells correspond, respectively, at a next time. Further, ∞ indicates a maximum value which can be represented with a number of bits used to represent a metric difference Δ.

Under the control of the metric difference (Δ) update control circuit 22, the metric difference (Δ) update cells 21a to 21d initialize only the states corresponding to the cells and through which the most likely path passes to Δ, and other states to ∞. Thereafter, under the control of the metric difference (Δ) update control circuit 22, the metric difference (Δ) update cells 21a to 21d select a metric difference Δ by means of the selector 23 when the cell-corresponding states are those through which the most likely path passes, and update the metric difference Δ based on path selection information for a next possible state, as will be described below, when the cell-corresponding states are other than those through which the most likely path passes.

First, the metric difference (Δ) update cells 21a to 21d select min (Δ1, Δ2) by means of the selector 23 under the control of the metric difference (Δ) update control circuit 22 when both paths going to a next possible state survive.

Also, the metric difference (Δ) update cells 21a to 21d select, by means of the selector 23, min (Δ1, Δ2) when one of the paths going to the next possible state survives and the other not surviving is going to a state through which the most likely path passes, and either Δ1 or Δ2 for a selected path when one of the paths going to the next possible state survives and the other not surviving is going to other than a state through which the most likely path passes.

Further, the metric difference (Δ) update cells 21a to 21d select, by means of the selector 23, one of the values Δ1 or Δ2 which is for the state through which the most likely path passes, when both the paths going to the next possible states do not survive and one of the next possible states is a one through which the most likely path passes, and ∞ when both the paths going to the next possible state do not survive and one of the next possible states is not a one through which the most likely path passes.

Each of the metric difference (Δ) update cells 21a to 21d stores into the register 24 a value selected by the selector 23 as a minimum Δ of the state.

Figure 21:
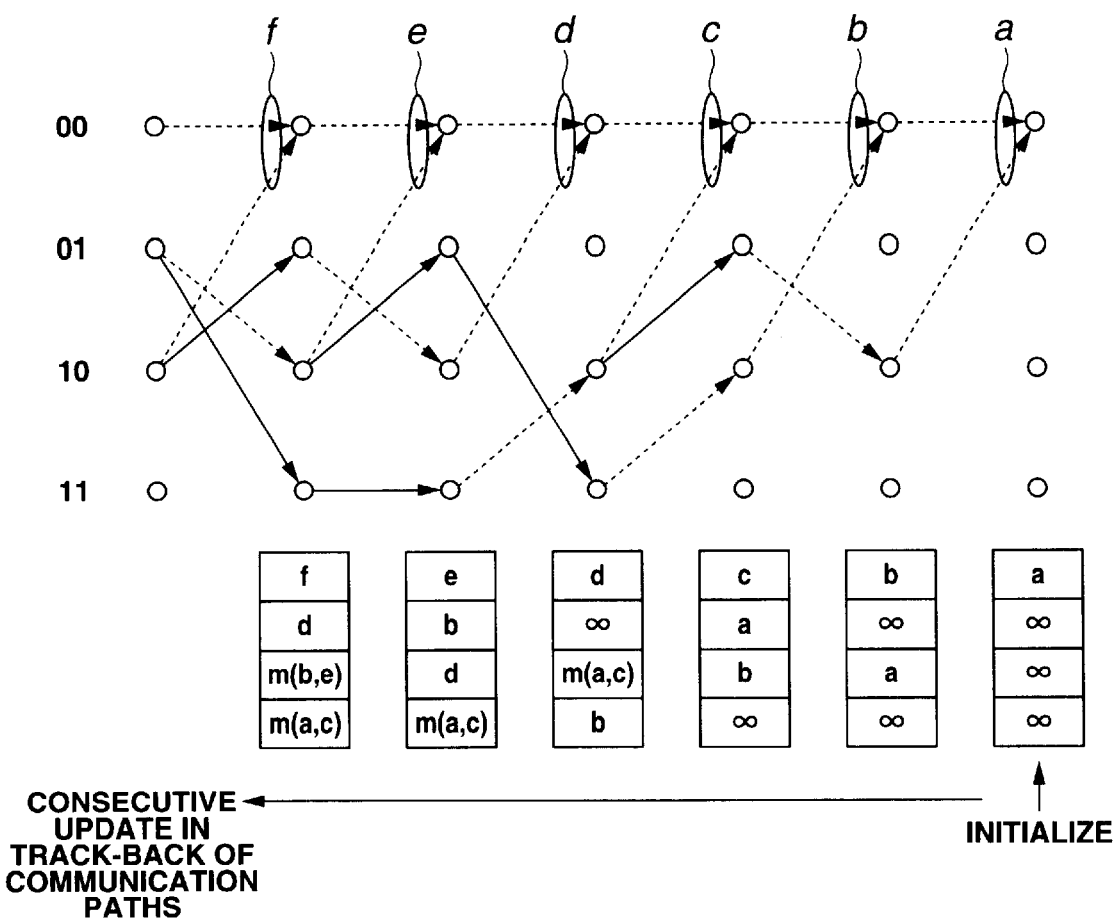
FIG. 21 explains the stored content, in each state, of each register in the minimum metric difference ($\Delta$) memory circuit.

To decode a code whose constraint length is 3 shown in FIG. 18 with an terminating length of 5 based on the above metric difference (Δ) updating method, the register 24 provided in the minimum metric difference (Δ) memory circuit 20 for each state stores a value as shown in FIG. 21. Thus, the register 24 for each state a minimum value of the metric difference for the most likely path in the process of tracing back the baths.

Using the above-mentioned minimum metric difference (Δ) memory circuit 20, the two-step SOVA decoder 10 can be constructed from RAMs as will be described below.

Figure 22:
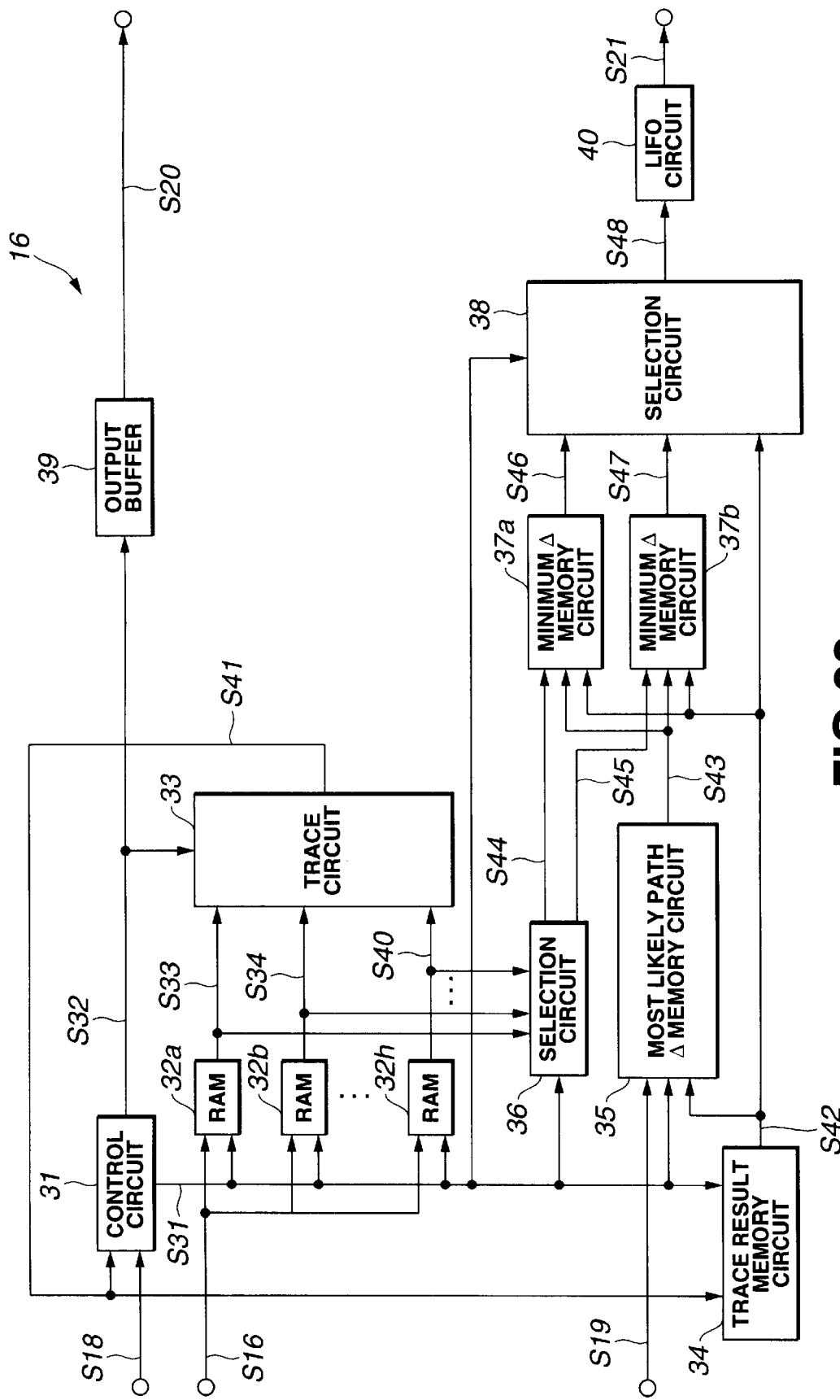
FIG. 22 is a block diagram of the path memory and likelihood update circuit provided in the two-step SOVA decoder.

The path memory and likelihood update circuit 16 in the two-step SOVA decoder 10 is architected as shown in FIG. 22. More specifically, the path memory and likelihood update circuit 16 includes a control circuit 31 supplied with the most likely state signal s18 and trace result signal s41 to output a control signal s31 and trace control signal s32, eight RAMs 32a to 32h to store path selection information, a trace circuit 33 to output the trace result signal s41, a trace result memory circuit 34 to store a result of tracing of the most likely path and output it as delayed trace result signal s42, a most likely path metric difference (Δ) memory circuit 35 to select and store the metric difference Δ of the most likely path and output it as a delayed most likely metric difference (Δ) signal s43, a selection circuit 36 to select path selection information for use to update the minimum metric difference Δ, minimum metric difference (Δ) memory circuits 37a and 37b constructed similarly to the minimum metric difference (Δ) memory circuit 20 to store the minimum values, a selection circuit 38 to select a state minimum metric difference (Δ) signal for use to acquire a soft-output, an output buffer 39 to determine and store decoded bits, and a last-in first-out (LIFO) circuit 40 serving as likelihood information storing means to correct logarithmic likelihood ratio information s48 into an original time-series order and output it as a logarithmic likelihood ratio s21.

In the path memory and likelihood update circuit 16, path selection information s16 supplied from the ACS circuit 12 is written into the RAMs 32a, 32b, ..., 32h according to the control signal s31 output from the control circuit 31. At the same time, in the path memory and likelihood update circuit 16, path selection information s33, s34, ..., s40 are read from the RAMs 32a, 32b, ..., 32h and supplied to the trace circuit 33 according to the control signal s31 output from the control circuit 31.

The trace circuit 33 traces based on path selection information s33, s34, ..., s40 according to the trace control signal s32 supplied from the control circuit 31, and supplies the result of tracing as the trace result signal s41 to the control circuit 31 and trace results memory circuit 34.

Based on the trace result signal s41 supplied from the trace circuit 33 and most likely state signal s18 supplied from the ACS circuit 12, the control circuit 31 produces a trace control signal s32 and supplies it to the trace circuit 33. Also the control circuit 31 supplies the produced trace control signals s32 to the output buffer 39 as well.

The output buffer 39 determines and stores decoded bits based on the trace control signal s32 supplied from the control circuit 31 and outputs a decoded data s20 at a time when the logarithmic likelihood ratio s21 is output from the LIFO circuit 40 which will further be described later.

On the other hand, the trace result memory circuit 34 stores the result of tracing the most likely path based on the trace result signal s41 supplied from the trace circuit 33. Then, according to the control signal s31 supplied from the control circuit 31, the trace result memory circuit 34 outputs a result of tracing the most likely path, stored therein, as delayed trace result signal s42 to the downstream most likely metric difference ($\Delta$) memory circuit 35, minimum metric difference ($\Delta$) memory circuits 37a and 37b and selection circuit 38.

Based on the metric difference delay signal s19 supplied from the metric difference delay circuit 15 and delayed trace result signal s42 supplied from the trace result memory circuit 34, the most likely path metric difference ($\Delta$) memory circuit 35 selects and stores a most likely path metric difference $\Delta$ from the metric difference delay signal s19. Then, the most likely path metric difference ($\Delta$) memory circuit 35 outputs a metric difference $\Delta$ stored therein as a most likely metric difference ($\Delta$) signal s43 to the downstream minimum metric difference ($\Delta$) memory circuits 37a and 37b according to the control signal s31 supplied from the control circuit 31.

Supplied with path selection information s33, s34, ..., s40 from the RAMs 32a, 32b, ..., 32h, respectively, the selection circuit 36 selects path selection information for use to update the minimum metric difference $\Delta$ according to the control signal s31 supplied from the control circuit 31. Then the selection circuit 36 outputs the selected path selection information as path selection information s44 and s45 to the downstream minimum metric difference ($\Delta$) memory circuits 37a and 37b, respectively.

According to the control signal s31 supplied from the control circuit 31, delayed trace result signal s42 supplied from the trace result memory circuit 34 and delayed most likely metric difference ($\Delta$) signal s43 supplied from the most likely path metric difference ($\Delta$) memory circuit 35, the minimum metric difference ($\Delta$) memory circuits 37a and 37b select and store a minimum metric difference $\Delta$ in each state and output it as state minimum metric difference ($\Delta$) signals s46 and s47 to the downstream selection circuit 38.

According to the control signal s31 supplied from the control circuit 31 and delayed trace result signal s42 supplied from the trace result memory circuit 34, the selection circuit 38 selects a state minimum metric difference ($\Delta$) signal for use to acquire a soft-output from the state minimum metric difference ($\Delta$) signals s46 and s47, determines minimum values for the most likely path and paths difference in number of input bits from the most likely path, and outputs it as logarithmic likelihood ratio information s48 to the downstream LIFO circuit 40. The logarithmic likelihood ratio information s48 is determined in an order contrary to the actual time-series order.

The LIFO circuit 40 stores the logarithmic likelihood ratio information s48 ordered contrary to the actual time-series order once, corrects it into the original time-series order and then outputs as a logarithmic likelihood ratio s21.

Thus, the path memory and likelihood update circuit 16 outputs the decoded data s20 and logarithmic likelihood ratio s21.

Figure 23:
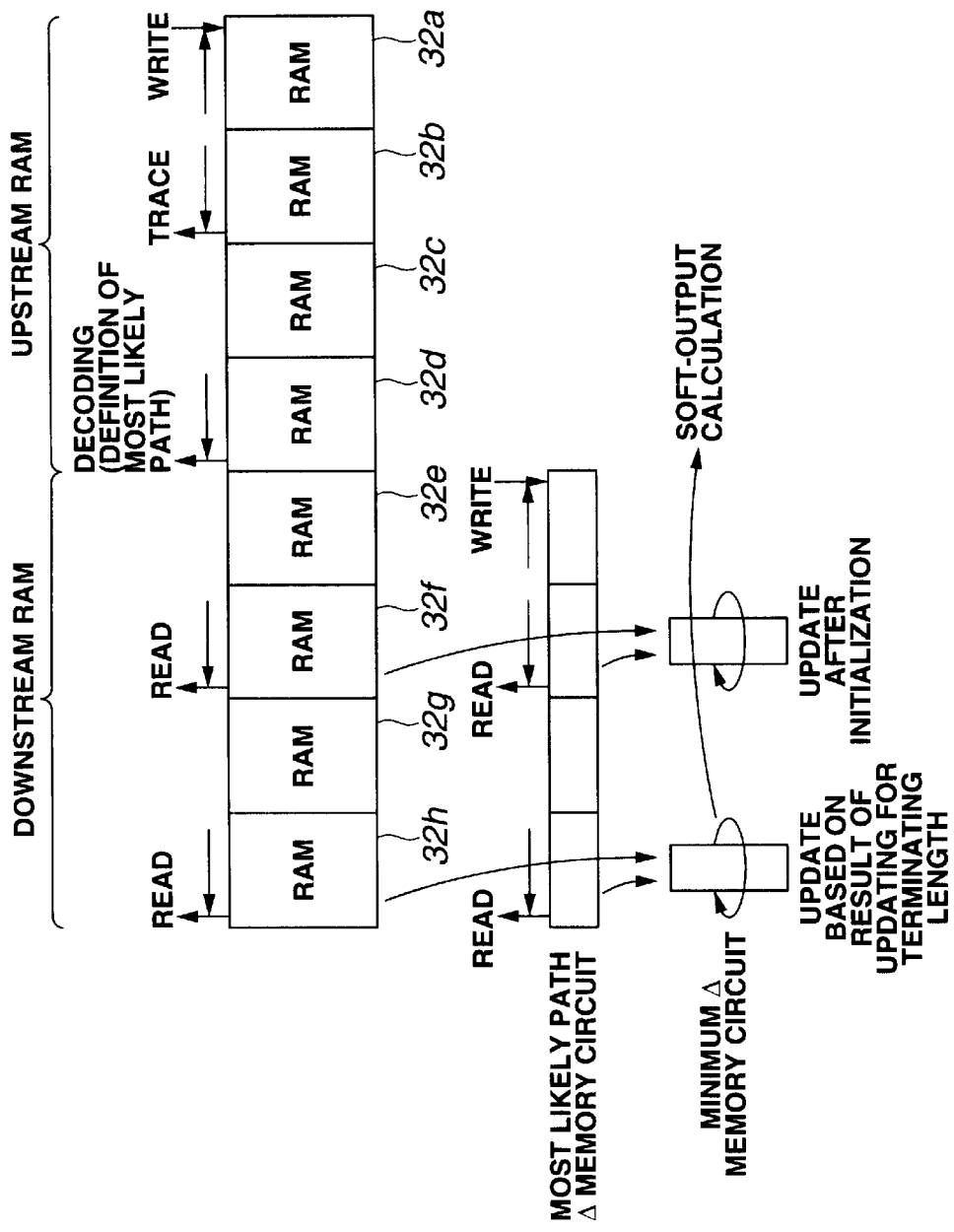
FIG. 23 explains the operations of the path memory and likelihood update circuit in the two-step SOVA decoder.

The eight RAMs 32a, 32b, ..., 32h provided in the path memory and logarithmic likelihood update circuit 16 work as shown in FIG. 23. They are grouped as an upstream group of RAMs 32a, 32b, 32c and 32d and a downstream group of RAMs 32e, 32f, 32g and 32h. The upstream group of the RAMs 32a to 32d serves as an upstream path memory circuit in the conventional two-step SOVA decoder, and the downstream group of the RAMs 32e to 32h works are the downstream path memory circuit.

The upstream group of the RAMs 32a to 32d works like the Viterbi decoder based on the conventional trace-back method.

Namely, in the path memory and likelihood update circuit 16, first the path selection information s16 supplied from the ACS circuit 12 is written into the RAM 32a in the time-series order.

Also in the path memory and likelihood update circuit 16, the path selection information s34 is read from the RAM 32b in an order contrary to the time-series order and paths for the terminating length are traced.

Then in the path memory and likelihood update circuit 16, no access is made to the RAM 32c but the path selection information s36 is read from the RAM 32d in an order contrary to the time-series order. The RAM 32d effects a trace for the terminating length, starting at the trace start point based on a result of the trace for the terminating length, to determine a most likely path and output decoded bits.

On the other hand, the downstream group of RAMs 32e to 32h uses the minimum metric difference ($\Delta$) memory circuits 37a and 37b to play the role of the downstream path memory circuit in the conventional two-step SOVA decoder.

That is, in the path memory and likelihood update circuit 16, no access is made to the RAM 32e but the value of the metric difference $\Delta$ in each state at the time in the section is supplied to the most likely path metric difference ($\Delta$) memory circuit 35 which will select and store the value of metric difference $\Delta$ of a state through which the most likely path passes.

Also, in the path memory and likelihood update circuit 16, the path selection information s38 is read from the RAM 32f in an order contrary to the time-series order. At the same time, the metric difference $\Delta$ is read from the most likely path metric difference ($\Delta$) memory circuit 35 in an order contrary to the time-series order and supplied as delayed most likely metric difference (Δ) signal s43 to the minimum metric difference (Δ) memory circuits 37a and 37b which will first be initialized to update the minimum metric difference Δ in each state at each time.

Further in the path memory and likelihood update circuit 16, no access is made to the RAM 32g but the path selection information s40 is read from the RAM 32h in an order contrary to the time-series order. At the same time, the metric difference Δ is read from the most likely path metric difference (Δ) memory circuit 35 as well in an order contrary to the time-series order, and supplied as delayed most likely metric difference (Δ) signal s43 to the minimum metric difference (Δ) memory circuits 37a and 37b. Then, the minimum metric difference (Δ) memory circuits 37a and 37b will update the minimum metric difference Δ in each state at each time, starting with the minimum metric difference Δ having been updated for the terminating length.

The RAMs 32a, 32b, . . . , 32h working as in the above have their respective functions shifted one by one each time an operation for the terminating length is done. Namely, the RAM 32b will, when in a next operation, play the role the RAM 32a has played, and the RAM 32c will, when in a next operation, play the role the RAM 32b has played. Subsequently, the RAM roles are switched similarly, and the RAM 32a will, when in a next operation, play the role the RAM 32h has played.

With the aforementioned memory operations, the two-step SOVA decoder 10 can use the RAMs for its intended purpose.

As having been described in the foregoing, the two-step SOVA decoder 10 includes the minimum metric difference (Δ) memory circuits 37a and 37b to store the minimum value of the metric difference Δ in each state and thus has not to read all input information bits for the terminating length at the same time when a soft-output is determined in the downstream path memory circuit. Therefore, the two-step SOVA decoder 10 stores path selection information s16 in the RAMs 32a to 32h, and traces the information. Thus, it can work at a high speed with a small circuit scale even when the code constraint length and terminating length are larger than in the conventional register-shift method.

Note that the present invention is not limited to the above-mentioned embodiments but applied even when the code constraint length and terminating length are of arbitrary values, respectively, not when a code whose constraint length is 3 is decoded with an terminating length of 5. Needless to say, the present invention can appropriately be modified without departing from the spirit and scope of the Claims given later.

What is claimed is:

1. A decoding method of decoding, in the soft-output Viterbi manner, an input convolutional code to provide a decoded data and likelihood information, comprising steps of storing, into a random-accessible path selection information storing means, path selection information indicative of more likely paths selected at each transition of the convolutional code;

storing, based on a trace result signal indicative of a result of a tracing effected for a terminating length based on the path selection information, a result of tracing of a most likely path being a sequence most likely to that of the convolutional code into a trace result storing means;

selecting, based on a delayed trace result signal indicative of a result of tracing of the most likely path stored in the trace result storing means and thus delayed, a metric difference for the most likely path from a metric difference delay signal resulted from a delay of the metric difference when the more likely paths are selected at each transition of the convolutional code, and storing it into a metric difference storing means;

storing, based on the delayed trace result signal and a delayed most likely metric difference signal indicative of a metric difference for the most likely path stored in the metric difference storing means, a minimum value of the metric difference for the most likely path into a minimum value storing means at each transition of the convolutional code; and acquiring the likelihood information based on the minimum value.

2. The method according to claim 1, wherein the minimum value storing means includes metric difference updating means for a number of the transitions;

the minimum value of the metric difference for the most likely path at each transition being stored into the metric difference updating means.

3. The method according to claim 2, wherein the metric difference updating means includes an update controlling means for selecting and updating a metric difference for the most likely path for storage;

the update controlling means controlling the difference between the most likely path and paths merging in the most likely path at a time when a transition state to which the metric difference updating means corresponds is a one through which the most likely path passes.

4. The method according to claim 3, wherein the update controlling means functions to:

select, when the transition state to which the metric difference updating means corresponding is not the one through which the most likely path corresponds and there survive two paths going to two possible transition states which are contiguous at a next time point from the transition state to which the metric difference updating means corresponds, one of the metric differences for the most likely path in the above two possible transition states having so far been stored in the metric difference updating means, whichever is smaller;

select, when the transition state to which the metric difference updating means corresponding is not the one through which the most likely path corresponds and one of the two paths going to the two possible transition states survives while the other path not surviving is going to the transition state through which the most likely path passes, one of the minimum values of the metric difference for the most likely path in the two possible transition states having so far been stored in the metric difference updating means, whichever is smaller;

select, when the transition state to which the metric difference updating means corresponding is not the one through which the most likely path corresponds and one of the two paths going to the two possible transition states survives while the other path not surviving is not going to the transition state through which the most likely path passes, one of the minimum values of the metric difference for the most likely path in the two possible transition states having so far been stored in the metric difference updating means, whichever corresponds to the selected path; and select, when the transition state to which the metric difference updating means corresponding is not the one through which the most likely path corresponds and both the two paths going to the two possible transition state do not survive while one of the two possible transition states is not the one through which the most likely path passes, a maximum value expressed with a number obits used for the metric difference for the most likely path.

5. The method according to claim 1, wherein the likelihood information acquired based on the minimum value of the metric difference for the most likely path is stored, the likelihood information is corrected into a time-series order by the LIFO method for provision as output, and the decoded data is output synchronously with a time at which the likelihood information is output.

6. The method according to claim 1, further comprising steps of:

computing a branch-metric based on the convolutional code;

selecting more likely paths based on the branch-metric to determine a statemetric;

normalizing the state-metric; and storing the normalized state-metric.

7. The method according to claim 1, wherein the path selection information storing means consists of eight banks; and input path selection information is written into the first bank in a time-series order;

the path selection information stored in the second bank is output in a contrary order to the time-series order to trace paths for an terminating length;

no access is made to the third bank;

the path selection information stored in the fourth bank is output in an order contrary to the time-series order and the paths for the terminating length are traced starting at the trace starting point based on the result of tracing for the terminating length to determine a most likely path;

no access is made to the fifth bank;

the path selection information stored in the sixth bank is output in an order contrary to the tune-series order;

no access is made to the seventh bank; and the path selection information stored in the eighth bank is output in an order contrary to the time-series order.

8. The method according to claim 7, wherein the functions of the first to eighth banks of the path selection information storing means are switched from one to another at every terminating length.

9. A decoder for decoding, in the soft-output Viterbi manner, an input convolutional code to provide a decoded data and likelihood information, the apparatus comprising:

means for storing, into a random-accessible path selection information storing means, path selection information indicative of more likely paths selected at each transition of the convolutional code;

means for storing, based on a trace result signal indicative of a result of a tracing effected for a terminating length based on the path selection information, a result of tracing of a most likely path being a sequence most likely to that of the convolutional code into a trace result storing means;

means for selecting, based on a delayed trace result signal indicative of a result of tracing of the most likely path stored in the trace result storing means and thus delayed, a metric difference for the most likely path from a metric difference delay signal resulted from a delay of the metric difference when the more likely paths are selected at each transition of the convolutional code, and storing it into a metric difference storing means; and means for storing, based on the delayed trace result signal and a delayed most likely metric difference signal indicative of a metric difference for the most likely path stored in the metric difference storing means, a minimum value of the metric difference for the most likely path into a minimum value storing means at each transition of the convolutional code; and the likelihood information being acquired based on the minimum value.

10. The apparatus according to claim 9, wherein the minimum value storing means includes metric difference updating means provided for a number of the transitions to store the minimum value of the metric difference for the most likely path at each transition.

11. The apparatus according to claim 10, wherein the metric difference updating means includes an update controlling means for selecting and updating a metric difference for the most likely path for storage;

the update controlling means controlling the difference between the most likely path and paths merging in the most likely path at a tune when a transition state to which the metric difference updating means corresponds is a one through which the most likely path passes.

12. The apparatus according to claim 11, wherein the update controlling means functions to:

select, when the transition state to which the metric difference updating means corresponding is not the one through which the most likely path corresponds and there survive two paths going to two possible transition states which are contiguous at a next time point from the transition state to which the metric difference updating means corresponds, one of the metric differences for the most likely path in the above two possible transition states having so far been stored in the metric difference updating means, whichever is smaller;

select, when the transition state to which the metric difference updating means corresponding is not the one through which the most likely path corresponds and one of the two paths going to the two possible transition states survives while the other path not surviving is going to the transition state through which the most likely path passes, one of the minimum values of the metric difference for the most likely path in the two possible transition states having so far been stored in the metric difference updating means, whichever is smaller;

select, when the transition state to which the metric difference updating means corresponding is not the one through which the most likely, path corresponds and one of the two paths going to the two possible transition states survives while the other path not surviving is not going to the transition state through which the most likely path passes, one of the minimum values of the metric difference for the most likely path in the two possible transition states having so far been stored in the metric difference updating means, whichever corresponds to the selected path; and select, when the transition state to which the metric difference updating means corresponding is not the one through which the most likely path corresponds and both the two paths going to the two possible transition state do not survive while one of the two possible transition states is not the one through which the most likely path passes, a maximum value expressed with a number of bits used for the metric difference for the most likely path.

13. The apparatus according to claim 9, further comprising means for tracing paths based on the path selection information output from the path selecting information storing means to output the trace result signal.

14. The apparatus according to claim 9, further comprising:

means for determining and storing the decoded data; and

LIFO type likelihood information storing means for storing the likelihood information acquired based on the minimum value of the metric difference for the most likely path and correcting and providing the likelihood information in a time-series order;

the decoded data storing means providing the decoded data synchronously with a time at which the likelihood information is output from the likelihood information storing means.

15. The apparatus according to claim 9, further comprising:

means for computing a branch-metric based on the convolutional code;

means for selecting more likely paths based on the branch-metric to determine a state-metric;

means for normalizing the state-metric; and means for storing the state-metric normalized by the normalizing means.

16. The apparatus according to claim 9, wherein the path selection information storing means consists of eight banks;

the first bank writes therein an input path selection information in a time-series order;

the second bank outputs the path selection information stored in an order contrary to the tune-series order to trace paths for an terminating length;

the third bank is not accessed;

the fourth bank outputs the path selection information stored therein in an order contrary to the time-series order and traces the paths for the terminating length starting from the trace starting point based on the result of tracing for the terminating length to determine a most likely path;

the fifth bank is not accessed;

the sixth bank outputs the path selection information stored therein in an order contrary to the time-series order;

the seventh bank is not accessed; and the eighth bank outputs the path selection information stored therein in an order contrary to the time-series order.

17. The apparatus according to claim 16, wherein the functions of the first to eighth banks of the path selection information storing means are switched from one to another at every terminating length.

* * * * *